(12) United States Patent
Lee et al.

(10) Patent No.: US 11,538,859 B2
(45) Date of Patent: Dec. 27, 2022

(54) SEMICONDUCTOR MEMORY DEVICE INCLUDING VARIABLE RESISTANCE LAYER

(71) Applicant: SAMSUNG ELECTRONICS CO., LTD., Suwon-si (KR)

(72) Inventors: Kyunghwan Lee, Suwon-si (KR); Yongseok Kim, Suwon-si (KR); Kohji Kanamori, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 16/657,453

(22) Filed: Oct. 18, 2019

(65) Prior Publication Data

US 2020/0343307 A1 Oct. 29, 2020

(30) Foreign Application Priority Data

Apr. 26, 2019 (KR) ........................ 10-2019-0048981

(51) Int. Cl.
*H01L 27/24* (2006.01)
*H01L 45/00* (2006.01)

(52) U.S. Cl.
CPC ........ *H01L 27/2481* (2013.01); *H01L 45/143* (2013.01); *H01L 45/144* (2013.01); *H01L 45/146* (2013.01); *H01L 45/147* (2013.01)

(58) Field of Classification Search
None
See application file for complete search history.

(56) References Cited

U.S. PATENT DOCUMENTS

| | | | |
|---|---|---|---|
| 8,748,971 B2 | 6/2014 | Tanaka et al. | |
| 8,809,943 B2 | 8/2014 | Lim et al. | |
| 8,901,712 B2 * | 12/2014 | Sasago | H01L 27/2481 257/536 |
| 9,343,672 B2 | 5/2016 | Park et al. | |
| 9,356,033 B2 | 5/2016 | Son et al. | |
| 9,431,412 B1 | 8/2016 | Kato et al. | |
| 9,449,870 B2 | 9/2016 | Eun et al. | |
| 9,478,284 B2 * | 10/2016 | Sasago | G11C 13/0097 |
| 9,524,980 B2 | 12/2016 | Lue | |
| 9,666,594 B2 | 5/2017 | Mizuno et al. | |
| 9,728,546 B2 | 8/2017 | Serov et al. | |
| 9,754,957 B2 | 9/2017 | Lee et al. | |
| 9,941,122 B2 | 4/2018 | Oh et al. | |
| 9,997,530 B2 | 6/2018 | Yon et al. | |

(Continued)

*Primary Examiner* — Nishath Yasmeen
(74) *Attorney, Agent, or Firm* — F. Chau & Associates, LLC

(57) ABSTRACT

A semiconductor memory device includes a stack structure comprising a plurality of insulating layers and a plurality of interconnection layers that are alternately and repeatedly stacked. A pillar structure is disposed on a side surface of the stack structure. The pillar structure includes an insulating pillar and a variable resistance layer disposed on the insulating pillar and positioned between insulating pillar and the stack structure. A channel layer is disposed on the variable resistance layer and is positioned between the variable resistance layer and the stack structure. A gate dielectric layer is disposed on the channel layer and is positioned between the plurality of interconnection layers and the channel layer. The channel layer is disposed between the variable resistance layer and the gate dielectric layer.

17 Claims, 23 Drawing Sheets

(56) References Cited

U.S. PATENT DOCUMENTS

| | | |
|---|---|---|
| 2012/0211718 A1 | 8/2012 | Shima et al. |
| 2012/0248399 A1* | 10/2012 | Sasago ............... H01L 45/1206 257/4 |
| 2014/0183619 A1 | 7/2014 | Chen |
| 2015/0155479 A1* | 6/2015 | Sasago ............... H01L 27/2454 257/4 |
| 2017/0092355 A1* | 3/2017 | Kurotsuchi .......... G11C 13/003 |
| 2017/0092655 A1* | 3/2017 | Jung ................ H01L 27/11582 |
| 2019/0123276 A1* | 4/2019 | Ratnam ............. G11C 13/0009 |

* cited by examiner

SEMICONDUCTOR MEMORY DEVICE INCLUDING VARIABLE RESISTANCE LAYER

CROSS-REFERENCE TO RELATED APPLICATION

This application claims priority under 35 U.S.C. § 119 to Korean Patent Application No. 10-2019-0048981, filed on Apr. 26, 2019, in the Korean Intellectual Property Office (KIPO), the disclosure of which is incorporated by reference in its entirety herein.

1. TECHNICAL FIELD

Devices and methods consistent with exemplary embodiments relate to a semiconductor memory device having a variable resistance layer, a method of operating the device, and a method of forming the device.

2. DISCUSSION OF RELATED ART

Techniques using stack structures have been developed to increase the integration density of semiconductor memory devices. A channel pillar is disposed to extend through a stack structure. The channel pillar includes a storage layer. However, the physical and chemical configurations of the storage layer directly affect a high integration density, power consumption, and operating speed of the semiconductor devices.

SUMMARY

The exemplary embodiments of the present inventive concepts are directed to providing a semiconductor memory device, which is advantageous to high integration density and exhibits low power consumption, a method of operating the device, and a method of forming the device.

According to an exemplary embodiment of the present inventive concepts, a semiconductor memory device includes a stack structure comprising a plurality of insulating layers and a plurality of interconnection layers that are alternately and repeatedly stacked. A pillar structure is disposed on a side surface of the stack structure. The pillar structure includes an insulating pillar and a variable resistance layer disposed on the insulating pillar and positioned between insulating pillar and the stack structure. A channel layer is disposed on the variable resistance layer and is positioned between the variable resistance layer and the stack structure. A gate dielectric layer is disposed on the channel layer and is positioned between the plurality of interconnection layers and the channel layer. The channel layer is disposed between the variable resistance layer and the gate dielectric layer.

According to an exemplary embodiment of the present inventive concepts, a semiconductor memory device includes a first stack structure and a second stack structure each comprising a plurality of insulating layers and a plurality of interconnection layers that are alternately and repeatedly stacked. An isolation insulating layer is disposed between the first and second stack structures. A pillar structure is disposed between the first and second stack structures and is configured to extend through the isolation insulating layer. The pillar structure includes an insulating pillar and a first variable resistance layer disposed on the insulating pillar and positioned between the insulating pillar and the first stack structure. A second variable resistance layer is disposed on the insulating pillar and is positioned between the insulating pillar and the second stack structure. A first channel layer is disposed on the first variable resistance layer and is positioned between the first variable resistance layer and the first stack structure. A second channel layer is disposed on the second variable resistance layer and is positioned between the second variable resistance layer and the second stack structure. A first gate dielectric layer is disposed on the first channel layer and is positioned between the first channel layer and the first stack structure. A second gate dielectric layer is disposed on the second channel layer and is positioned between the second channel layer and the second stack structure.

According to an exemplary embodiment of the present inventive concepts, there is provided a semiconductor memory device that includes a stack structure comprising a plurality of insulating layers and a plurality of interconnection layers which are alternately and repeatedly stacked. A pillar structure is configured to extend through the stack structure in a vertical direction. An isolation insulating layer is configured to intersect the stack structure and the pillar structure and extend through the stack structure and the pillar structure in the vertical direction. The pillar structure includes an insulating pillar and a variable resistance layer disposed on the insulating pillar and positioned between the insulating pillar and the stack structure. A channel layer is disposed on the variable resistance layer and is positioned between the variable resistance layer and the stack structure. A gate dielectric layer is disposed on the channel layer and is positioned between the plurality of interconnection layers and the channel layer. The channel layer is disposed between the variable resistance layer and the gate dielectric layer.

According to an exemplary embodiment of the present inventive concepts, a semiconductor memory device includes a stack structure comprising a plurality of insulating layers and a plurality of interconnection layers that are alternately and repeatedly stacked. An isolation insulating layer is configured to intersect the stack structure and extend through the stack structure in a vertical direction. A pillar structure is configured to intersect the isolation insulating layer and extend through the stack structure and the isolation insulating layer in the vertical direction. The pillar structure includes an insulating pillar and a variable resistance layer configured to surround a side surface of the insulating pillar. A channel layer is configured to surround a side surface of the variable resistance layer. A gate dielectric layer is configured to surround a side surface of the channel layer. The channel layer is disposed between the variable resistance layer and the gate dielectric layer.

According to an exemplary embodiment of the present inventive concepts, a semiconductor memory device includes a stack structure comprising a plurality of insulating layers and a plurality of memory layers that are alternately and repeatedly stacked. A gate structure is disposed on a side surface of the stack structure. Each of the plurality of memory layers includes a channel layer and a variable resistance layer configured to contact the channel layer.

DETAILED DESCRIPTION OF EXEMPLARY EMBODIMENTS

Figure 1:
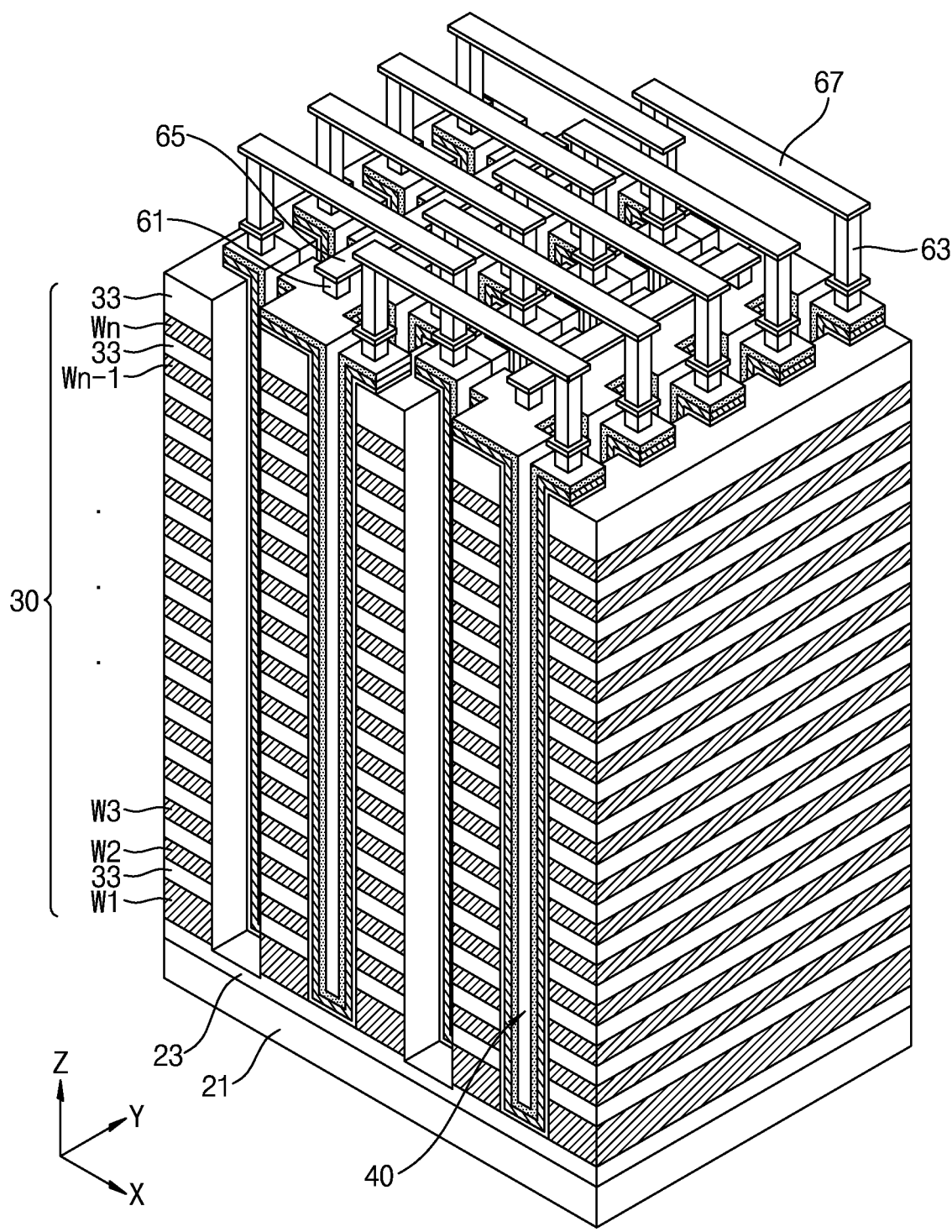
FIG. 1 is a perspective view illustrating a semiconductor memory device according to an exemplary embodiment of the present inventive concepts.

FIG. 1 is a perspective view illustrating a semiconductor memory device according to an exemplary embodiment of the present inventive concepts. The semiconductor memory device according to the exemplary embodiment may include a non-volatile memory such as a vertical NAND (VNAND) having a split cell structure or a three-dimensional (3D) flash memory having a split cell structure.

Referring to FIG. 1, the semiconductor memory device may include a substrate 21, a first insulating layer 23, a plurality of stack structures 30, a plurality of pillar structures 40, a source plug 61, a bit plug 63, a source line 65, and a bit line 67. Each of the plurality of stack structures 30 may include a plurality of insulating layers 33 and a plurality of interconnection layers W1 to Wn which are alternately and repeatedly stacked. For example, the alternating insulating layers 33 and interconnection layers W1 to Wn may be arranged in the Z direction.

Figure 2:
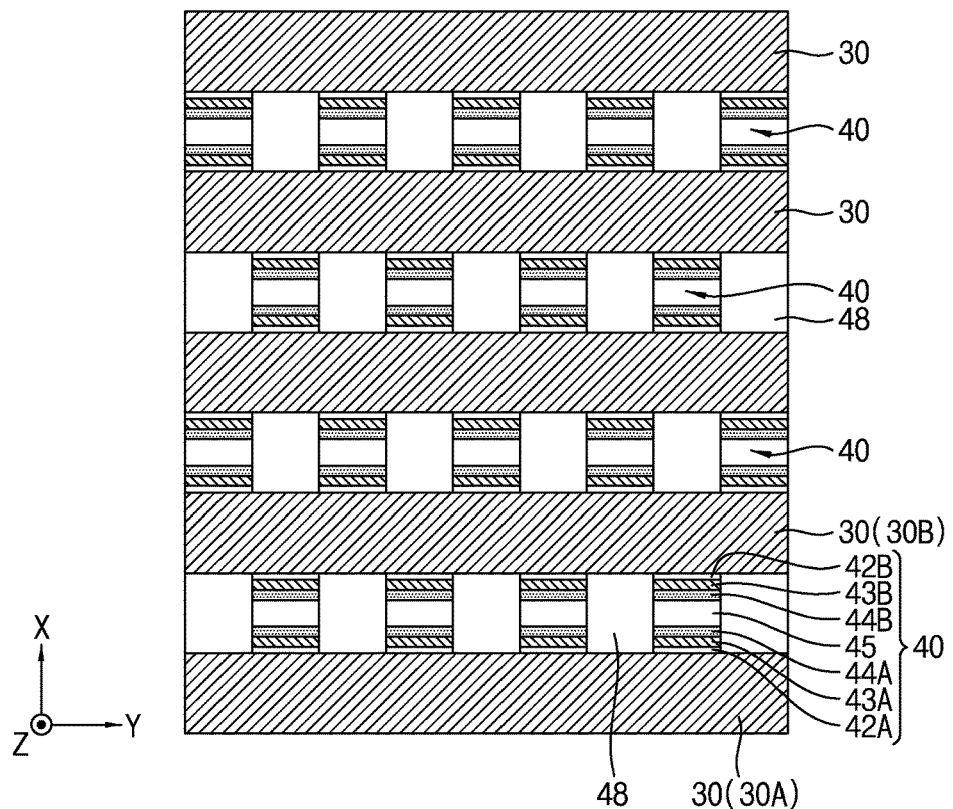
FIG. 2 is a top plan view illustrating a semiconductor memory device according to an exemplary embodiment of the present inventive concepts.

FIG. 2 is a top plan view illustrating a semiconductor memory device according to an exemplary embodiment of the present inventive concepts.

Referring to FIG. 2, the semiconductor memory device may include a plurality of stack structures 30, 30A, and 30B, a plurality of pillar structures 40, and an isolation insulating layer 48. The plurality of stack structures 30, 30A, and 30B may include a first stack structure 30A and a second stack structure 30B. The first stack structure 30A and second stack structure 30B may be arranged in the X direction. Each of the plurality of pillar structures 40 may include first and second gate dielectric layers 42A and 42B, first and second channel layers 43A and 43B, first and second variable resistance layers 44A and 44B, and an insulating pillar 45. In the exemplary embodiment shown in FIG. 2, the first and second gate dielectric layers 42A and 42B are disposed directly on the first and second channel layers 43A and 43B, respectively in the X direction. The first and second variable resistance layers 44A and 44B are disposed directly on the first and second channel layers 43A and 43B, respectively in the X direction. The first and second variable resistance layers 44A and 44B are also disposed directly on the insulating pillar 45 in the X direction. The plurality of pillar structures 40 are disposed between adjacent stack structures 30 in the X direction and the isolating insulating layer 48 is disposed between adjacent pillar structures (e.g., in the Y direction).

Figure 3:
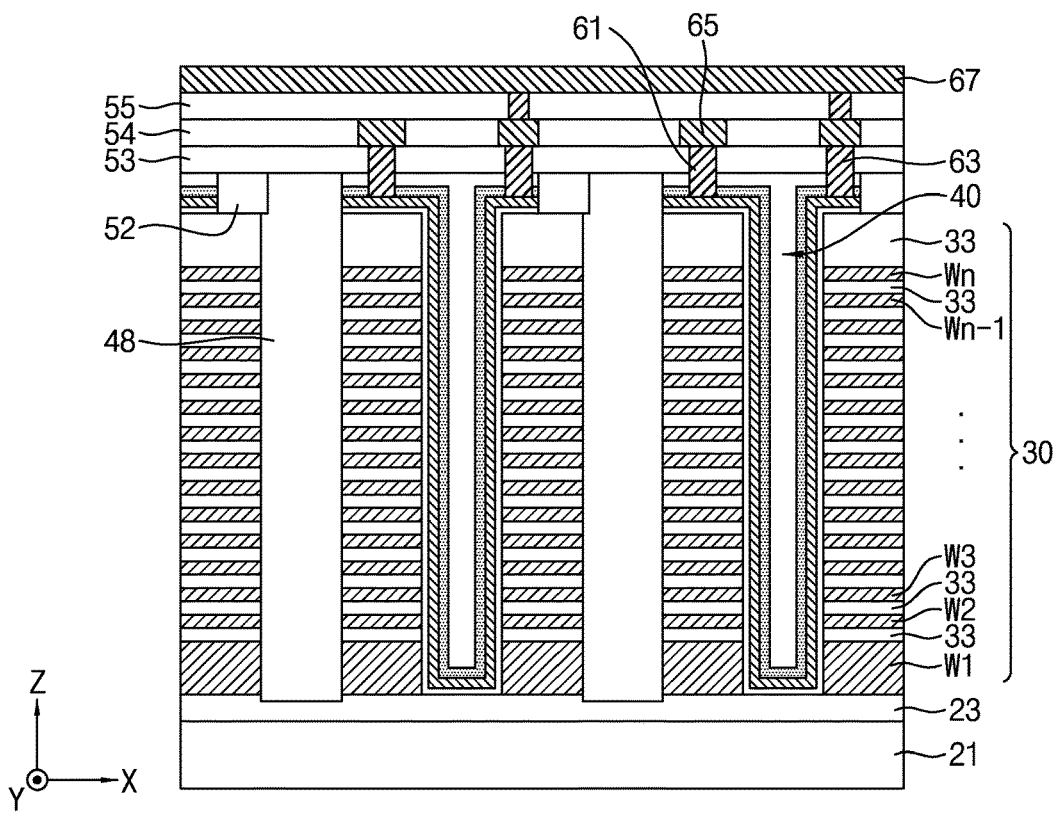
FIG. 3 is a cross-sectional view illustrating a semiconductor memory device according to an exemplary embodiment of the present inventive concepts.
Figure 4:
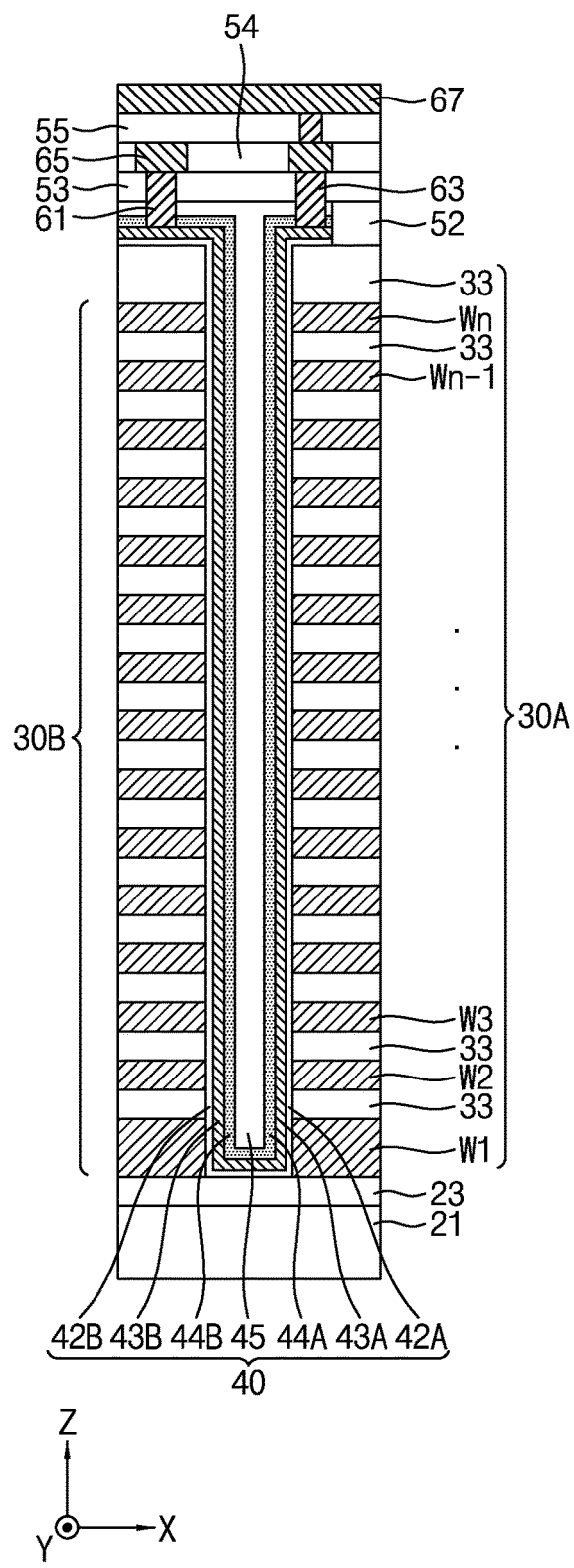
FIG. 4 is a cross-sectional view of a portion of FIG. 3 according to an exemplary embodiment of the present inventive concepts.
Figure 5:
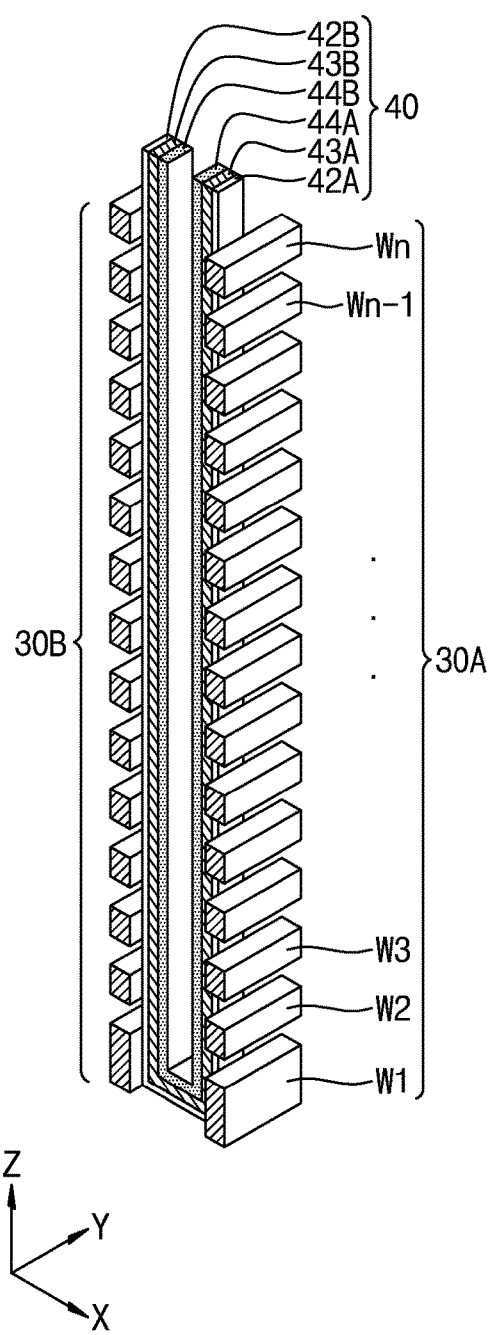
FIG. 5 is a perspective view of some components of FIG. 4 according to an exemplary embodiment of the present inventive concepts.

FIG. 3 is a cross-sectional view illustrating a semiconductor memory device according to an exemplary embodiment of the inventive concept. FIG. 4 is a cross-sectional view of a portion of FIG. 3. FIG. 5 is a perspective view of some components of FIG. 4.

Referring to FIG. 3, the semiconductor memory device may include a substrate 21, a first insulating layer 23, a plurality of stack structures 30, a plurality of pillar structures 40, an isolation insulating layer 48, second to fifth insulating layers 52, 53, 54, and 55, a source plug 61, a bit plug 63, a source line 65, and a bit line 67. Each of the plurality of stack structures 30 may include a plurality of insulating layers 33 and a plurality of interconnection layers W1 to Wn which are alternately and repeatedly stacked, as previously described.

The substrate 21 may include a semiconductor substrate such as a silicon wafer. The plurality of interconnection layers W to Wn may include a conductive material such as polysilicon, a metal, a metal nitride, a metal oxide, a metal silicide, conductive carbon, or a combination thereof. In an exemplary embodiment, the plurality of interconnection layers W1 to Wn may include polysilicon. However, exemplary embodiments of the present inventive concepts are not limited thereto. Each of the first insulating layer 23, the plurality of insulating layers 33, the isolation insulating layer 48, and the second to fifth insulating layers 52, 53, 54, and 55 may include silicon oxide, silicon nitride, silicon oxynitride, a low-k dielectric material, a high-k dielectric material, or a combination thereof. The source plug 61, the bit plug 63, the source line 65, and the bit line 67 may include a metal, a metal nitride, a metal oxide, a metal silicide, polysilicon, conductive carbon, or a combination thereof. However, exemplary embodiments of the present inventive concepts are not limited thereto.

Referring to FIG. 4, a semiconductor memory device may include a substrate 21, a first insulating layer 23, first and second stack structures 30A and 30B, a pillar structure 40, second to fifth insulating layers 52, 53, 54, and 55, a source plug 61, a bit plug 63, a source line 65, and a bit line 67. Each of the first and second stack structures 30A and 30B may include a plurality of insulating layers 33 and a plurality of interconnection layers W1 to Wn which are alternately and repeatedly stacked, as previously described. The pillar structure 40 may include first and second gate dielectric layers 42A and 42B, first and second channel layers 43A and 43B, first and second variable resistance layers 44A and 44B, and an insulating pillar 45, as previously described.

The first and second gate dielectric layers 42A and 42B may include silicon oxide, silicon nitride, silicon oxynitride, a high-k dielectric material, or a combination thereof. The first and second channel layers 43A and 43B may include a semiconductor layer such as a polysilicon layer. The first and second variable resistance layers 44A and 44B may include at least one of: NiO, CuO, CoO, $Fe_2O_3$, HfO, $TiO_2$, $Ta_2O_5$, $Nb_2O_5$, $SrTiO_3$ (STO), $SrZrO_3$, AlO, SiO, SiN, lanthanum strontium manganese oxide (LSMO), lanthanum calcium manganese oxide (LCMO), praseodymium calcium manganese oxide (PCMO), praseodymium lanthanum calcium manganese oxide (PLCMO), yttrium barium copper oxide (YBCO), bismuth strontium calcium copper oxide (BSCCO), $Bi:SrTiO_3$, $Cr:SrTiO_3$, HfSiO, AlSiO, tungsten oxide (WO), Mott, GeSbTe, carbon (C)-doped GeSbTe, nitrogen (N)-doped GeSbTe, SnSbTe, GeAsTe, GeSbSe, GeTe—$Sb_2Te_3$, $Zr_{60}Al_{15}Ni_{25}$, Fe—Co—B—Si—Nb. The insulating pillar 45 may include silicon oxide, silicon nitride, silicon oxynitride, a low-k dielectric material, a high-k dielectric material, or a combination thereof. However, exemplary embodiments of the present inventive concepts are not limited thereto.

In an exemplary embodiment, from among the plurality of interconnection layers W1 to Wn, a lowermost interconnection layer W1 (e.g., in the Z direction) may correspond to a connection gate. From among the plurality of interconnection layers W1 to Wn, some interconnection layers W2 to Wn−1 may correspond to word lines. From among the plurality of interconnection layers W1 to Wn, an uppermost interconnection layer Wn of the first stack structure 30A (e.g., in the Z direction) may correspond to a string select line (SSL). From among the plurality of interconnection layers W1 to Wn, an uppermost interconnection layer Wn of the second stack structure 30B (e.g., in the Z direction) may correspond to a ground select line (GSL).

Referring to FIG. 5, the second gate dielectric layer 42B may be continuous with the first gate dielectric layer 42A. The second channel layer 43B may be continuous with the first channel layer 43A. The second variable resistance layer 44B may be continuous with the first variable resistance layer 44A. For example, the first gate dielectric layer 42A and second gate dielectric layer 42B may extend in the Z direction and may include a bottom surface extending in the X direction that connects the first gate dielectric layer and second gate dielectric layer. The first channel layer 43A and second channel layer 43B may extend in the Z direction and may include a bottom surface extending in the X direction that connects the first channel layer and second channel layer. The first variable resistance layer 44A and second variable resistance layer 44B may extend in the Z direction and may include a bottom surface extending in the X direction that connects the first variable resistance layer and second variable resistance layer.

Referring again to FIGS. 1 to 5, the first insulating layer 23 may be disposed on the substrate 21. The first stack structure 30A and the second stack structure 30B may be disposed on the first insulating layer 23. The isolation insulating layer 48 and the pillar structure 40 may be disposed between the first stack structure 30A and the second stack structure 30B. The isolation insulating layer 48 may intersect a space between the first stack structure 30A and the second stack structure 30B and extend through the space in a vertical direction (e.g., Z direction). A lower end of the isolation insulating layer 48 (e.g., in the Z direction) may be in contact with the first insulating layer 23. For example, the lower end of the isolation insulating layer 48 may be in contact with a top surface of the first insulating layer 23 (e.g., in the Z direction).

The pillar structure 40 may extend through the isolation insulating layer 48 and be in contact with the first insulating layer 23. For example, as shown in FIG. 4, a bottom surface (e.g., in the Z direction) of the first gate dielectric layer 42A and second gate dielectric layer 42B may contact a top surface of the first insulating layer 23. The first variable resistance layer 44A may be disposed between the insulating pillar 45 and the first stack structure 30A. The second variable resistance layer 44B may be disposed between the insulating pillar 45 and the second stack structure 30B. The first channel layer 43A may be disposed between the first variable resistance layer 44A and the first stack structure 30A. The second channel layer 43B may be disposed between the second variable resistance layer 44B and the second stack structure 30B.

The first gate dielectric layer 42A may be disposed between the first channel layer 43A and the first stack structure 30A. The first gate dielectric layer 42A may be disposed between the plurality of interconnection layers W1 to Wn and the first channel layer 43A. The first gate dielectric layer 42A may be in direct contact with corresponding ones of the plurality of interconnection layers W1 to Wn and the first channel layer 43A. The second gate dielectric layer 42B may be disposed between the second channel layer 43B and the second stack structure 30B. The second gate dielectric layer 42B may be disposed between the plurality of interconnection layers W1 to Wn and the second channel layer 43B. The second gate dielectric layer 42B may be in direct contact with corresponding ones of the plurality of interconnection layers W1 to Wn and the second channel layer 43B.

The first channel layer 43A may be disposed between the first variable resistance layer 44A and the first gate dielectric layer 42A. The first variable resistance layer 44A may be in direct contact with the insulating pillar 45 and the first channel layer 43A. The second channel layer 43B may be disposed between the second variable resistance layer 44B and the second gate dielectric layer 42B. The second variable resistance layer 44B may be in direct contact with the insulating pillar 45 and the second channel layer 43B.

The bit line 67 may be connected to an upper end (e.g., in the Z direction) of the first channel layer 43A through the bit plug 63. A bottom surface (e.g., in the Z direction) of the bit plug 63 may contact a top surface (e.g., in the Z direction) of the first channel layer 43A. As shown in FIG. 1, the bit plug 63 may extend to the bit line 67. The source line 65 may be connected to an upper end of the second channel layer 43B through the source plug 61. A bottom surface (e.g., in the Z direction) of the source plug 61 may contact a top surface (e.g., in the Z direction) of the second channel layer 43B.

Figure 6:
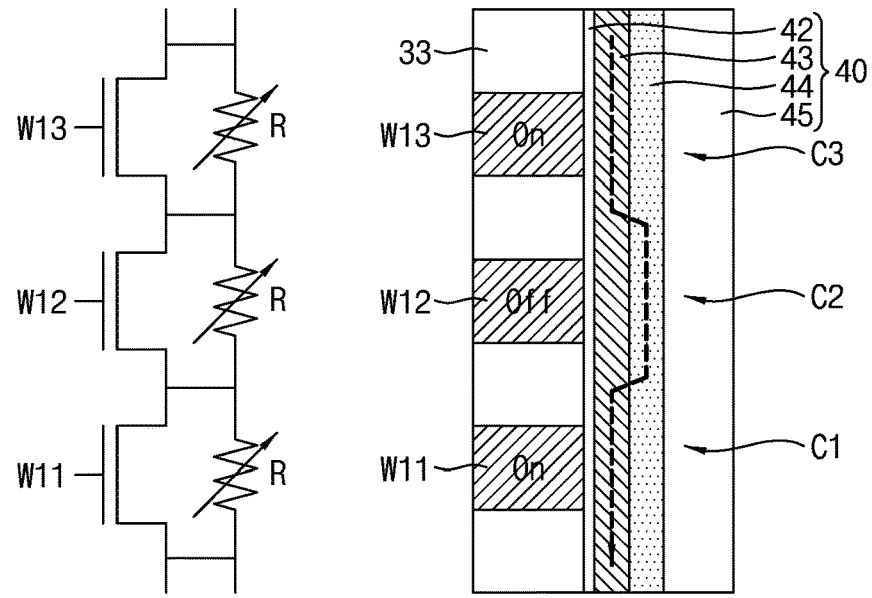
FIG. 6 is a partial cross-sectional view and an equivalent circuit diagram illustrating a method of operating a semiconductor memory device according to an exemplary embodiment of the present inventive concepts.

FIG. 6 illustrates a partial cross-sectional view and equivalent circuit diagram illustrating a method of operating a semiconductor memory device according to an exemplary embodiment of the present inventive concepts.

Referring to FIG. 6, the semiconductor memory device may include a plurality of insulating layers 33, first to third interconnection layers W1, W12, and W13, and a pillar structure 40. The pillar structure 40 may include a gate dielectric layer 42, a channel layer 43, a variable resistance layer 44, and an insulating pillar 45, as previously described. First to third memory cells C1, C2, and C3 may be formed in regions in which the first to third interconnection layers W1, W12, and W13 intersect the pillar structure 40. Each of the first to third interconnection layers W1, W12, and W13 may serve as agate electrode. The variable resistance layer 44 may include substantially the same configuration as the first and second variable resistance layers 44A and 44B described with reference to FIG. 4. The variable resistance layer 44 may exhibit a plurality of variable resistances R adjacent to and corresponding to the first to third interconnection layers W11, W12, and W13.

In an exemplary embodiment, a first voltage higher than a threshold voltage may be applied to each of the first interconnection layer W11 and the third interconnection layer W13 and a second voltage lower than the threshold voltage may be applied to the second interconnection layer W12 or the second interconnection layer may be grounded so that the second memory cell C2 may be selected. A write current may be applied to both ends of the channel layer 43. The write current may flow through the channel layer 43 adjacent to the first interconnection layer W11, the variable resistance layer 44 adjacent to the second interconnection layer W12, and the channel layer 43 adjacent to the third interconnection layer W13. The write current may switch the variable resistance layer 44 adjacent to the second interconnection layer W12 to a low-resistance state or a high-resistance state. A read current may be applied to both ends of the channel layer 43. The read current may flow through the channel layer 43 adjacent to the first interconnection layer W11, the variable resistance layer 44 adjacent to the second interconnection layer W12, and the channel layer 43 adjacent to the third interconnection layer W13. Data may be read from the second memory cell C2 in response to the read current.

Figure 7:
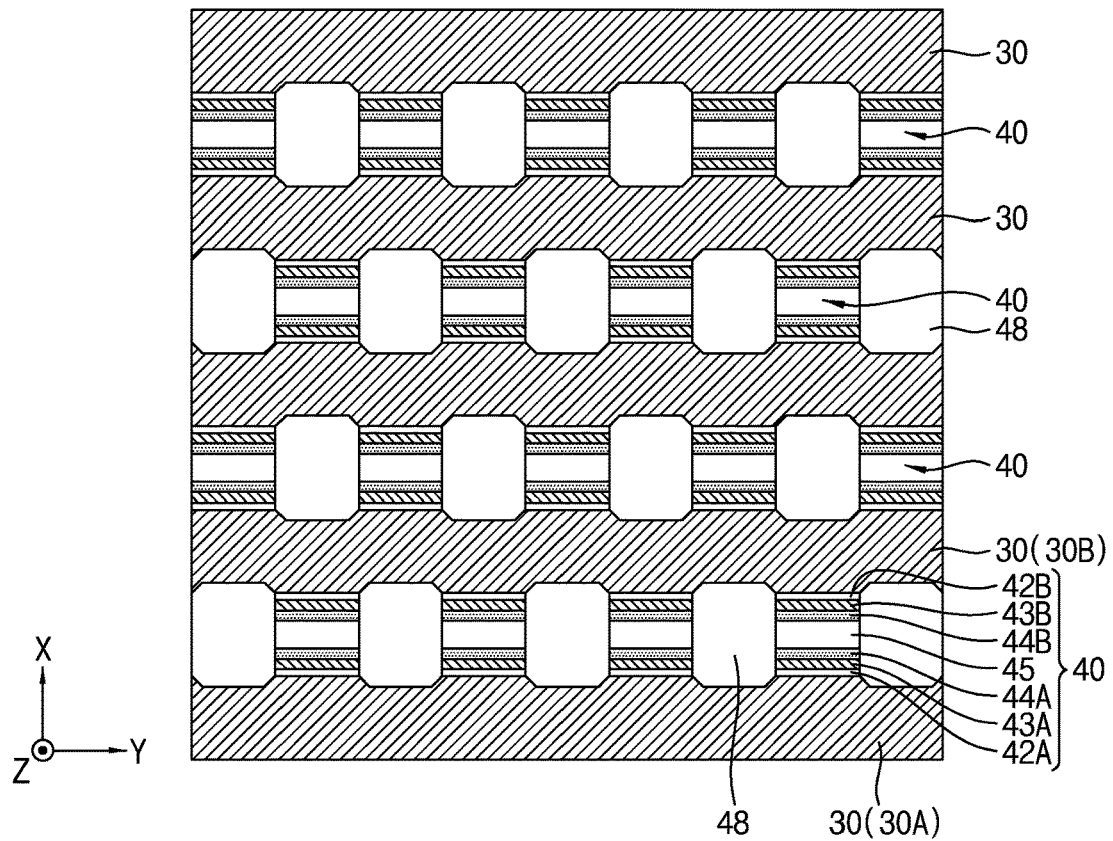
FIGS. 7 and 8 are top plan views illustrating a semiconductor memory device according to an exemplary embodiment of the present inventive concepts.
Figure 8:
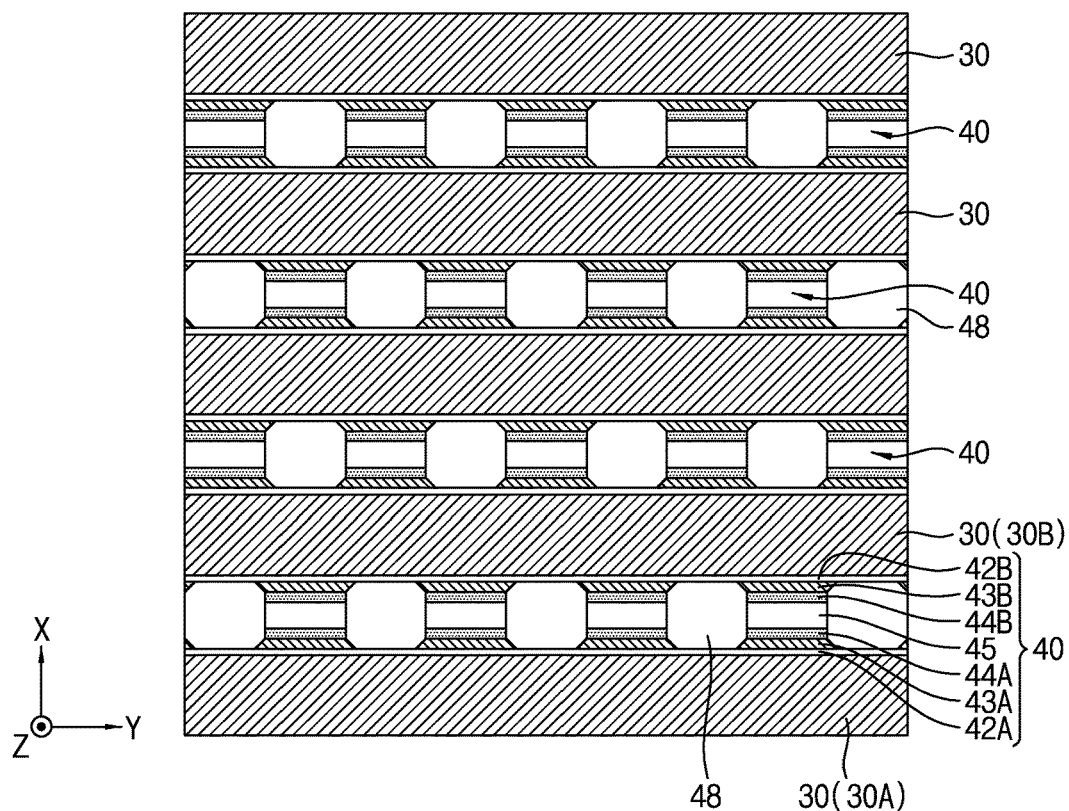

FIGS. 7 and 8 are top plan views illustrating semiconductor memory devices according to exemplary embodiments of the present inventive concepts.

Referring to FIG. 7, an isolation insulating layer 48 may exhibit various shapes. The isolation insulating layer 48 may extend through a plurality of stack structures 30 (e.g., in an X direction) and may extend in the Z direction. A lateral width of the isolation insulating layer 48 (e.g., a length in the X direction) may be greater than a lateral width (e.g., a length in the X direction) of each of a plurality of pillar structures 40. The isolation insulating layer 48 may be in direct contact with the plurality of stack structures 30.

In an exemplary embodiment, each of the plurality of stack structures 30 may include a minor axis in a first lateral direction (e.g., an X direction) and a major axis in a second lateral direction (e.g., a Y direction). However, exemplary embodiments of the present inventive concepts are not limited thereto. The second lateral direction may be perpendicular to the first lateral direction. The plurality of stack structures 30 may be disposed apart from each other in the first lateral direction. The plurality of stack structures 30 may be disposed parallel to each other. The isolation insulating layer 48 and the plurality of pillar structures 40 may be disposed between the plurality of stack structures 30. A lateral width of the isolation insulating layer 48 in the first lateral direction may be greater than a lateral width of each of the plurality of pillar structures 40 in the first lateral direction, as previously described. The isolation insulating layer 48 may intersect an entire portion of the plurality of pillar structures 40 in the first lateral direction. The isolation insulating layer 48 may be in direct contact with side surfaces (e.g., lateral ends in the Y direction) of first and second gate dielectric layers 42A and 42B, side surfaces (e.g., lateral ends in the Y direction) of first and second channel layers 43A and 43B, side surfaces (e.g., lateral ends in the Y direction) of first and second variable resistance layers 44A and 44B, a side surface (e.g., lateral ends in the Y direction) of an insulating pillar 45, and side surfaces (e.g., side surfaces extending in the Y direction) of the plurality of stack structures 30.

Referring to FIG. 8, a lateral width of an isolation insulating layer 48 in the first lateral direction may be less than a lateral width of each of a plurality of pillar structures 40. First and second gate dielectric layers 42A and 42B may be disposed between a plurality of stack structures 30 and side surfaces of the isolation insulating layer 48 that extend in the Y direction.

In an exemplary embodiment, the isolation insulating layer 48 and the plurality of pillar structures 40 may be disposed between the plurality of stack structures 30. For example, the plurality of stack structures 30 may be arranged in the X direction with respect to the isolation insulating layer 48 and the plurality of pillar structures 40. A lateral width of the isolation insulating layer 48 in the first lateral direction may be less than a lateral width of each of the plurality of pillar structures 40 in the first lateral direction. The first gate dielectric layer 42A may extend between a side surface of the isolation insulating layer 48 that extends in the Y direction and the first stack structure 30A. The second gate dielectric layer 42B may extend between a side surface of the isolation insulating layer 48 that extends in the Y direction and the second stack structure 30B.

Figure 9:
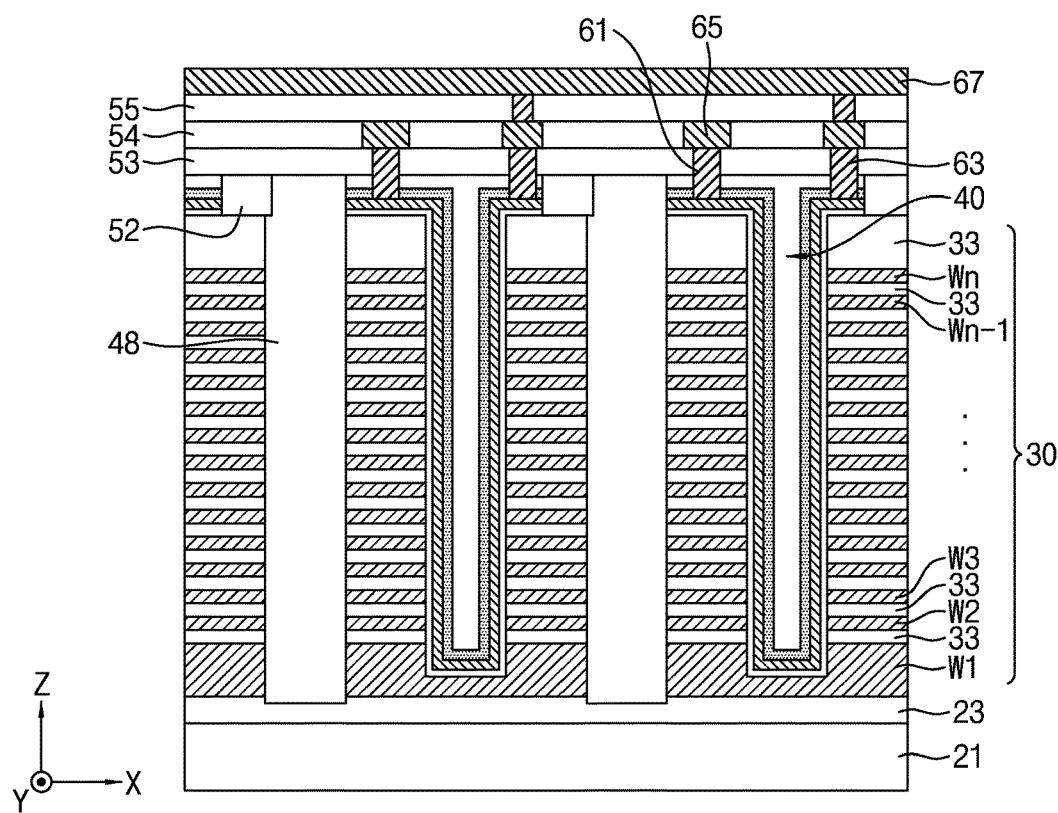
FIGS. 9 to 11 are cross-sectional views illustrating a semiconductor memory device according to an exemplary embodiment of the present inventive concepts.
Figure 10:
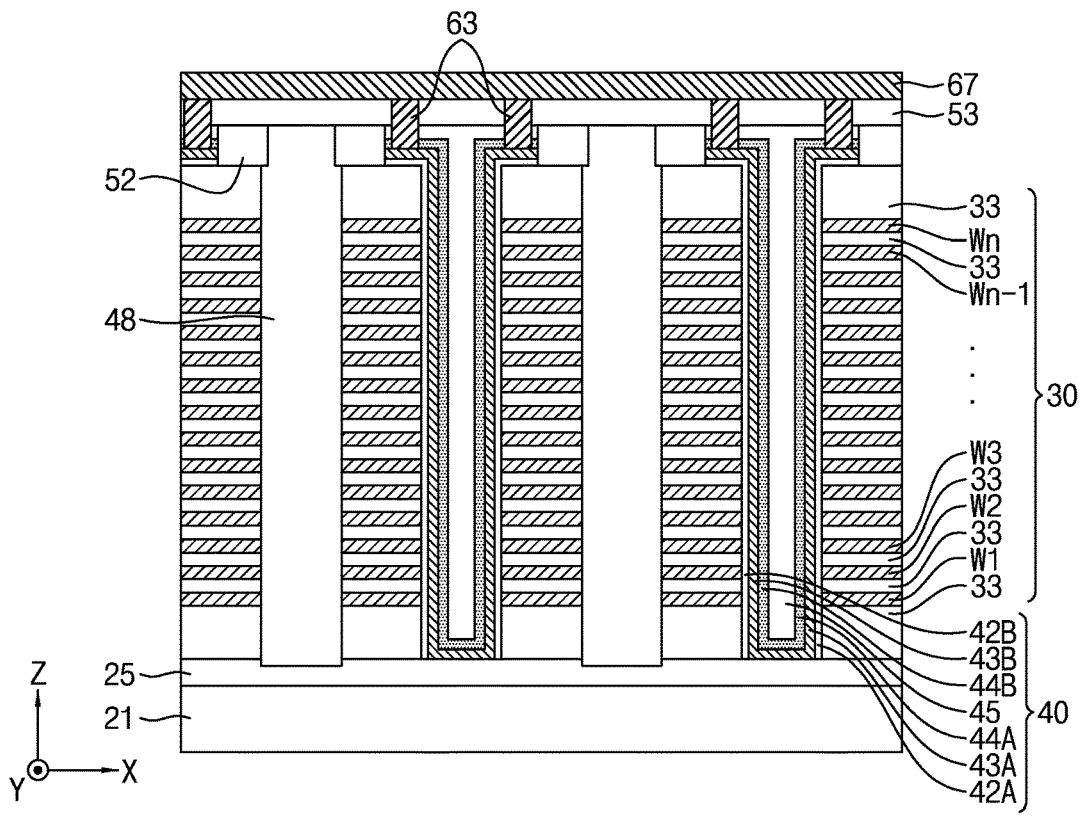
Figure 11:
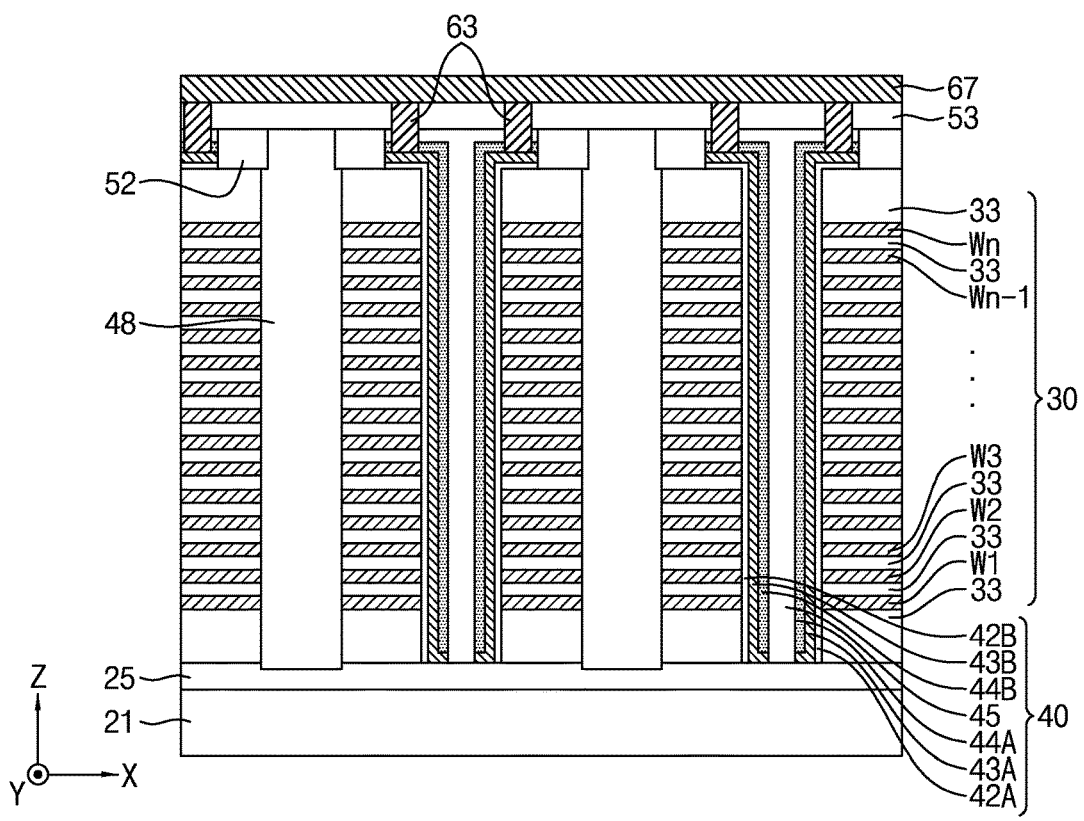

FIGS. 9 to 11 are cross-sectional views illustrating a semiconductor memory device according to exemplary embodiments of the present inventive concepts.

Referring to FIG. 9, from among a plurality of interconnection layers W1 to Wn, a lowermost interconnection layer W1 (e.g., in the Z direction) may correspond to a connection gate. From among the plurality of interconnection layers W1 to Wn, the lowermost interconnection layer W1 may surround lower side surfaces (e.g., extending in the Z direction) and bottom portions (e.g., extending in the X direction) of a plurality of pillar structures 40. For example, a portion of the lowermost interconnection layer W1 may be disposed directly between a bottom surface of the first dielectric layer and second dielectric layer and the first insulating layer 23.

Referring to FIG. 10, a lower conductive layer 25 may be disposed on a substrate 21. For example, the lower conductive layer 25 may be disposed directly on a top surface of the substrate (e.g., in the Z direction). The lower conductive layer 25 may serve as a source line. The lower conductive layer 25 may be formed by implanting N-type impurities or P-type impurities into the substrate 21. In an exemplary embodiment, the substrate 21 may include P-type impurities, and the lower conductive layer 25 may include N-type impurities. However, exemplary embodiments of the present inventive concepts are not limited thereto. From among a plurality of interconnection layers W1 to Wn, a lowermost interconnection layer W1 (e.g., in the Z direction) may correspond to a GSL. From among the plurality of interconnection layers W1 to Wn, an uppermost interconnection layer Wn (e.g., in the Z direction) may correspond to an SSL. The first channel layer 43A and the second channel layer 43B may extend through the first gate dielectric layer 42A and the second gate dielectric layer 42B and be in direct contact with the lower conductive layer 25. The first gate dielectric layer 42A and the second gate dielectric layer 42B may not include a bottom surface extending in the X direction.

Referring to FIG. 11, an insulating pillar 45 may extend through first and second variable resistance layers 44A and 44B, first and second channel layers 43A and 43B, and first and second gate dielectric layers 42A and 42B and be in direct contact with the lower conductive layer 25.

Figure 12:
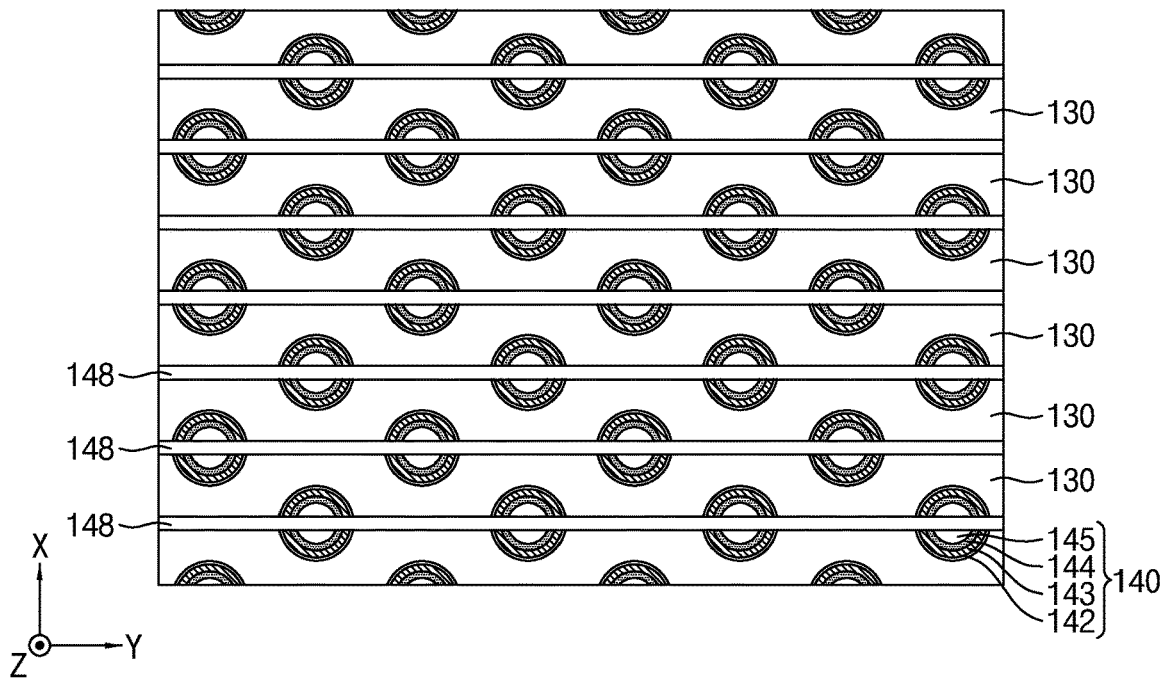
FIG. 12 is a top plan view illustrating a semiconductor memory device according to an exemplary embodiment of the present inventive concepts.
Figure 13:
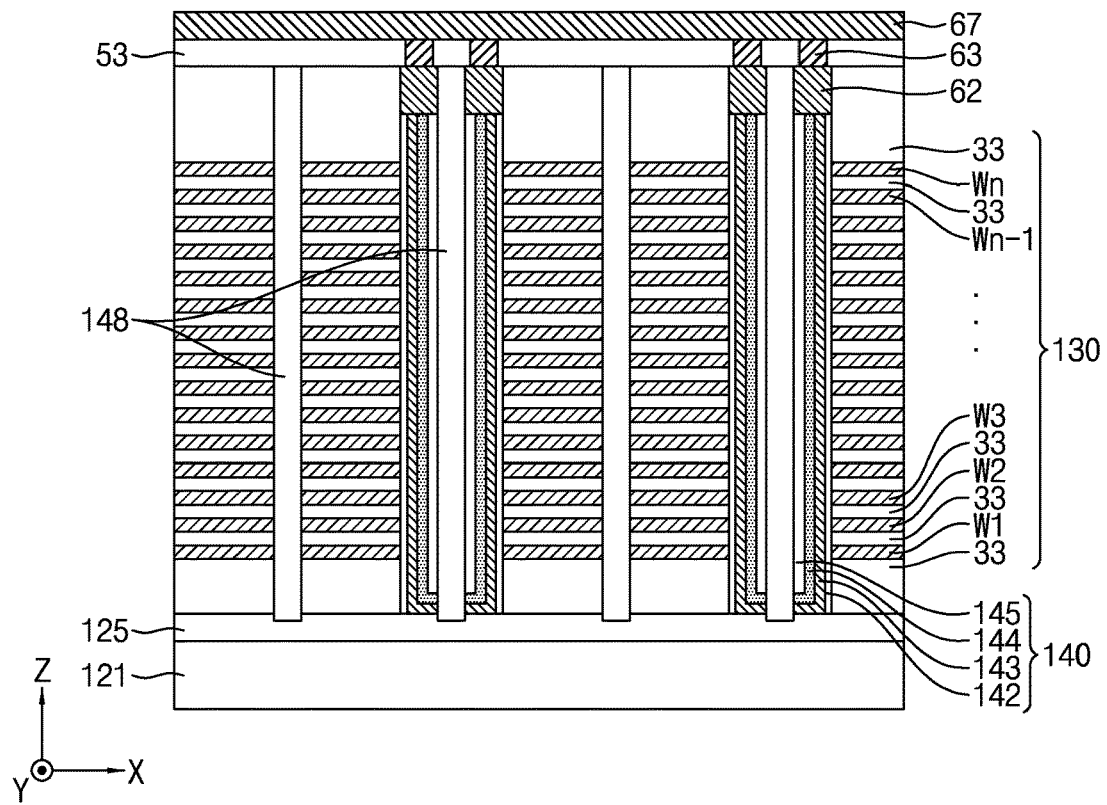
FIGS. 13 and 14 are cross-sectional views illustrating a semiconductor memory device according to an exemplary embodiment of the present inventive concepts.
Figure 14:
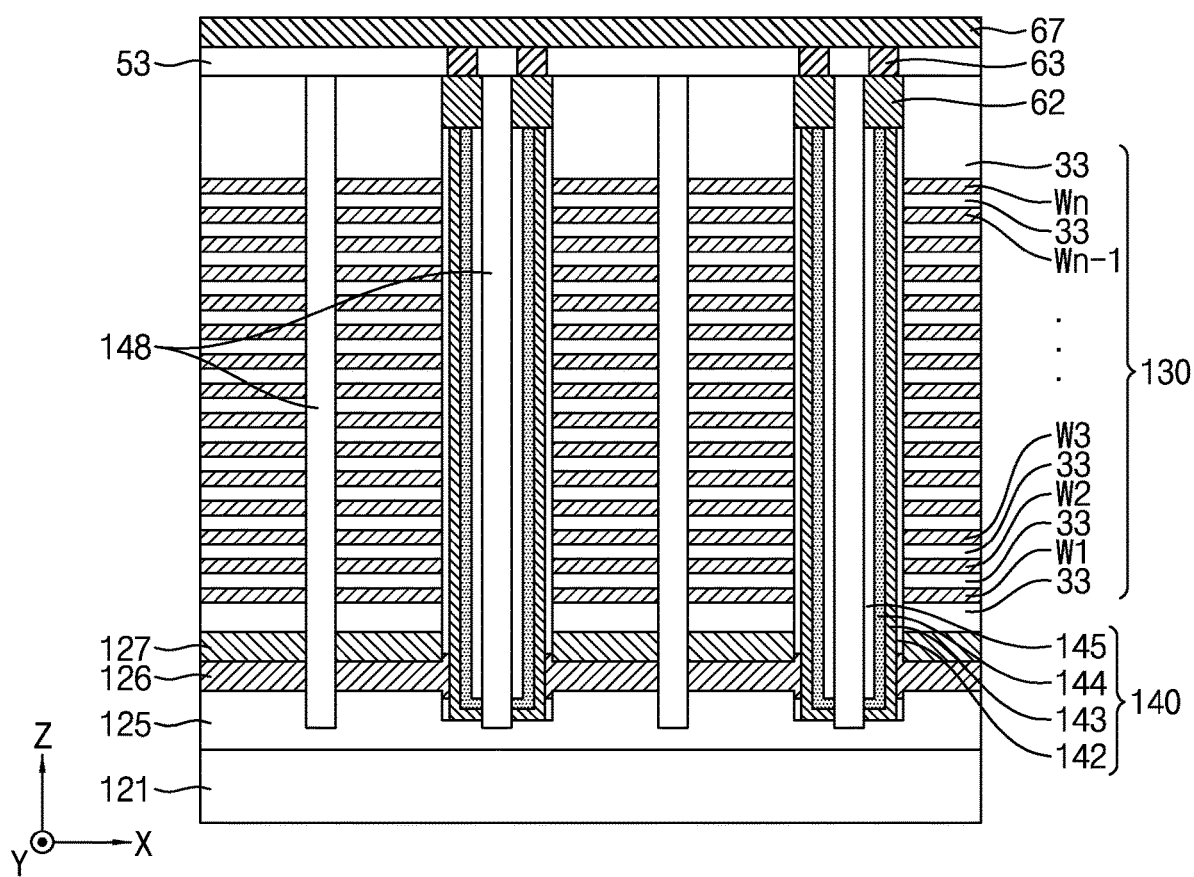

FIG. 12 is a top plan view illustrating a semiconductor memory device according to an exemplary embodiment of the present inventive concepts. FIGS. 13 and 14 are cross-sectional views illustrating the semiconductor memory device shown in FIG. 12.

Referring to FIG. 12, the semiconductor memory device may include a plurality of stack structures 130, a plurality of pillar structures 140, and an isolation insulating layer 148. The plurality of stack structures may be arranged in the X direction and may have a major axis in the Y direction and a minor axis in the X direction. The isolation insulating layer 148 may be arranged in the X direction and may extend through the pillar structures 140 in the Y direction. Each of the plurality of pillar structures 140 may include a gate dielectric layer 142, a channel layer 143, a variable resistance layer 144, and an insulating pillar 145.

Referring to FIG. 13, a semiconductor memory device may include a substrate 121, a lower conductive layer 125, a stack structure 130, a plurality of pillar structures 140, an isolation insulating layer 148, a third insulating layer 53, a plurality of bit pads 62, a plurality of bit plugs 63, and a bit line 67. The stack structure 130 may include a plurality of insulating layers 33 and a plurality of interconnection layers W1 to Wn which are alternately and repeatedly stacked, as previously described. Each of the plurality of pillar structures 140 may include a gate dielectric layer 142, a channel layer 143, a variable resistance layer 144, and an insulating pillar 145, as previously described.

Referring again to FIGS. 12 and 13, the lower conductive layer 125 may be disposed on the substrate 121. For example, the lower conductive layer 125 may be disposed directly on a top surface of the substrate 121 in the Z direction. The stack structure 130 may be disposed on the lower conductive layer 125. Each of the plurality of pillar structures 140 may extend through the stack structure 130 in a vertical direction (e.g., Z direction) and contact the lower conductive layer 125. The channel layer 143 may extend through the gate dielectric layer 142 and be in direct contact with the lower conductive layer 125. The plurality of bit pads 62 may be disposed on the plurality of pillar structures 140. Each of the plurality of bit pads 62 may be in direct contact with the channel layer 143. The isolation insulating layer 148 may intersect the plurality of bit pads 62, the plurality of pillar structures 140, and the stack structure 130, extend therethrough in the vertical direction (e.g., Z direction), and be in contact with the lower conductive layer 125. The isolation insulating layer 148 may extend in the Z direction from the lower conductive layer 125 to a bottom surface of the third insulating layer 53.

In an exemplary embodiment, the variable resistance layer 144 may be disposed between the insulating pillar 145 and the stack structure 130. The channel layer 143 may be disposed between the variable resistance layer 144 and the stack structure 130. The gate dielectric layer 142 may be disposed between the channel layer 143 and the stack structure 130. The gate dielectric layer 142 may be disposed between the plurality of interconnection layers W1 to Wn and the channel layer 143. The channel layer 143 may be disposed between the variable resistance layer 144 and the gate dielectric layer 142. The isolation insulating layer 148 may extend through the plurality of bit pads 62, the insulating pillar 145, the variable resistance layer 144, the channel layer 143, and the gate dielectric layer 142 in the vertical direction (e.g., Z direction) and be in contact with the lower conductive layer 125. The bit line 67 may be connected to an upper end of the channel layer 143 through the bit plug 63 and the plurality of bit pads 62.

Referring to FIG. 14, a semiconductor memory device may include a substrate 121, a lower conductive layer 125, a buried conductive layer 126, a support plate 127, a stack structure 130, a plurality of pillar structures 140, an isolation insulating layer 148, a third insulating layer 53, a bit pad 62, a bit plug 63, and a bit line 67. Each of the plurality of pillar structures 140 may include a gate dielectric layer 142, a channel layer 143, a variable resistance layer 144, and an insulating pillar 145.

The lower conductive layer 125 may be disposed on the substrate 121. For example, the lower conductive layer 125 may be disposed directly on a top surface of the substrate 121 (e.g., in the Z direction). The buried conductive layer 126 may be disposed on the lower conductive layer 125. For example, the buried conductive layer 126 may be disposed directly on a top surface of the lower conductive layer 125 (e.g., in the Z direction). The support plate 127 may be disposed on the buried conductive layer 126. For example, the support plate 127 may be disposed directly on a top surface of the buried conductive layer 126 in the Z direction. The stack structure 130 may be disposed on the support plate 127. The support plate 127 may include polysilicon. The buried conductive layer 126 may include a metal, a metal nitride, a metal oxide, a metal silicide, polysilicon, conductive carbon, or a combination thereof. Each of the plurality of pillar structures 140 may extend through the stack structure 130, the support plate 127, and the buried conductive layer 126 in a vertical direction (e.g., the Z direction) and be in contact with the lower conductive layer 125.

The buried conductive layer 126 may serve as a source line. The buried conductive layer 126 may extend through a side surface of the gate dielectric layer 142 and be in direct contact with lower side surfaces of the channel layer 143 that extend in the Z direction.

Figure 15:
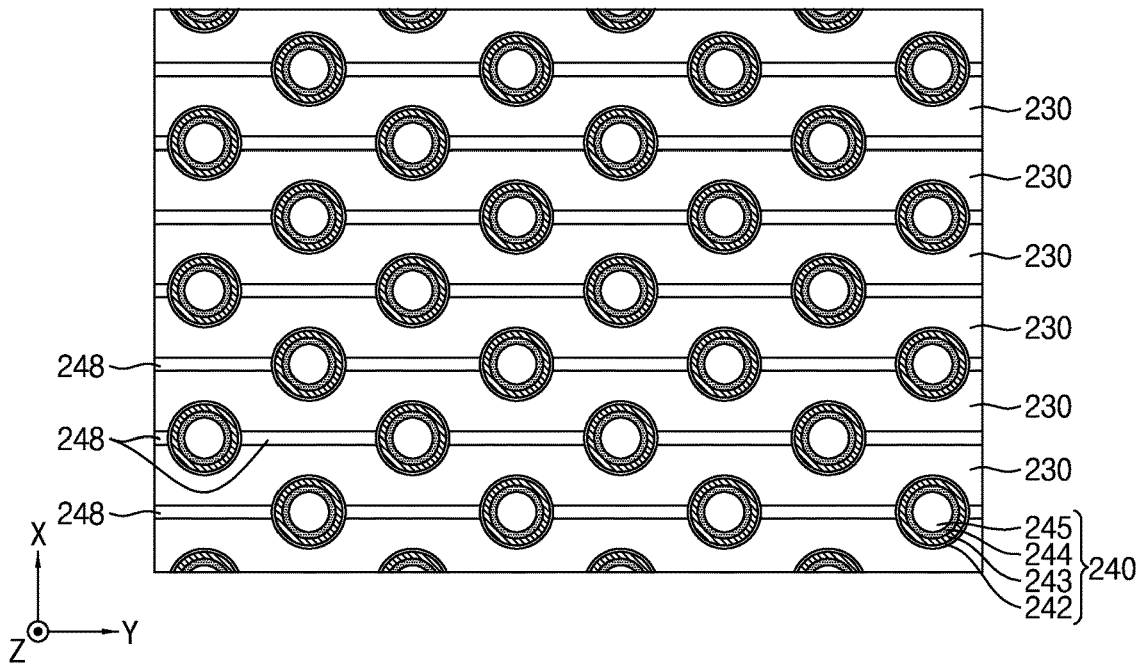
FIG. 15 is a top plan view illustrating a semiconductor memory device according to an exemplary embodiment of the present inventive concepts.
Figure 16:
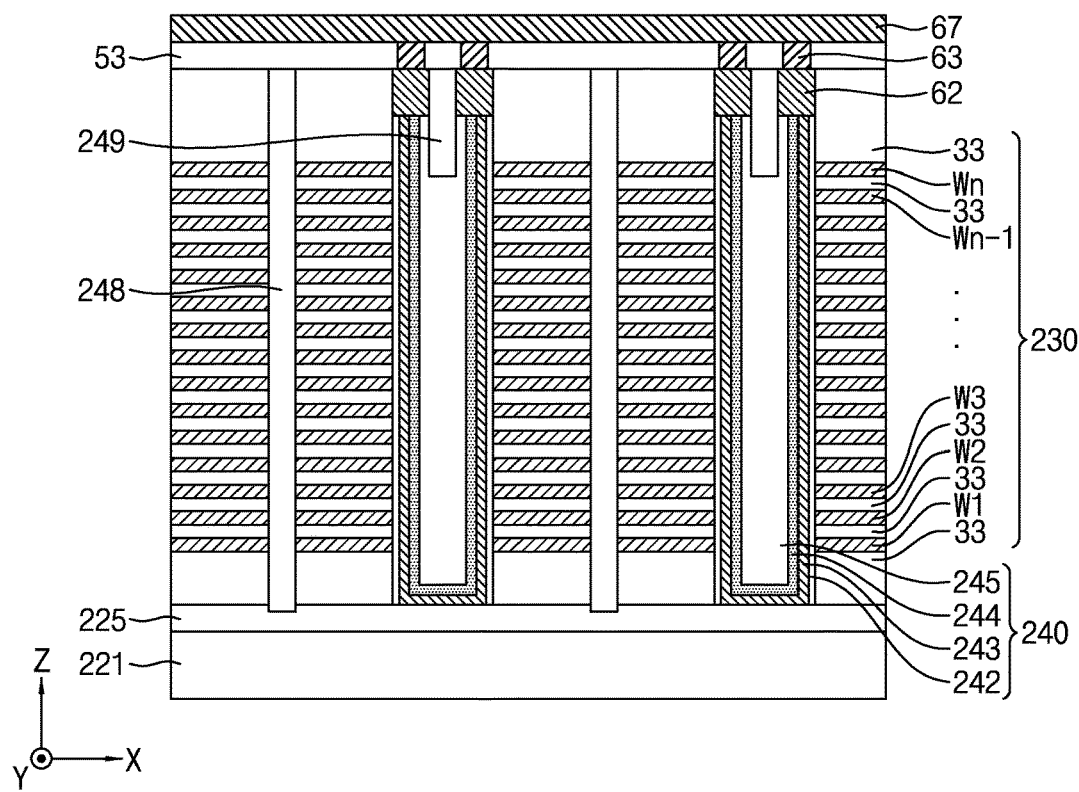
FIG. 16 is a cross-sectional view illustrating a semiconductor memory device according to an exemplary embodiment of the present inventive concepts.

FIG. 15 is a top plan view illustrating a semiconductor memory device according to an exemplary embodiment of the present inventive concepts. FIG. 16 is a cross-sectional view illustrating the semiconductor memory device shown in FIG. 15.

Referring to FIG. 15, the semiconductor memory device may include a plurality of stack structures 230, a plurality of pillar structures 240, and an isolation insulating layer 248. Each of the plurality of pillar structures 240 may include a gate dielectric layer 242, a channel layer 243, a variable resistance layer 244, and an insulating pillar 245.

Referring to FIG. 16, the semiconductor memory device may include a substrate 221, a lower conductive layer 225, a plurality of stack structures 230, a plurality of pillar structures 240, an isolation insulating layer 248, a pad isolation layer 249, a third insulating layer 53, a bit pad 62, a bit plug 63, and a bit line 67. Each of the plurality of stack structures 230 may include a plurality of insulating layers 33 and a plurality of interconnection layers W1 to Wn which are alternately and repeatedly stacked, as previously described. Each of the plurality of pillar structures 240 may include a gate dielectric layer 242, a channel layer 243, a variable resistance layer 244, and an insulating pillar 245, as previously described.

Referring again to FIGS. 15 and 16, the lower conductive layer 225 may be disposed on the substrate 221. The stack structure 230 may be disposed on the lower conductive layer 225. The isolation insulating layer 248 may intersect the stack structure 230, extend through the stack structure 230 in a vertical direction (e.g., a Z direction), and come into contact with the lower conductive layer 225. However, unlike the isolating insulating layer 148 of the exemplary embodiment of FIG. 13, the isolation insulating layer 248 in the exemplary embodiment of FIGS. 15 and 16 does not extend through the plurality of pillar structures 240. As shown in FIG. 16, the pad isolation layer 249 may extend through plurality of bit pads and may have a bottom surface disposed on an upper region of the insulating pillar 245 (e.g., in the Z direction).

Each of the plurality of pillar structures 240 may intersect the isolation insulating layer 248 (e.g., in the Y direction), extend through the stack structure 230 and the isolation insulating layer 248 in the vertical direction (e.g., the Z direction), and come into contact with the lower conductive layer 225. The variable resistance layer 244 may surround a side surface and a bottom of the insulating pillar 245. The channel layer 243 may surround a side surface and a bottom of the variable resistance layer 244. The gate dielectric layer 242 may surround a side surface of the channel layer 243. The gate dielectric layer 242 does not include a bottom surface extending in the X direction. The channel layer 243 may be disposed between the variable resistance layer 244 and the gate dielectric layer 242. The channel layer 243 may extend through the gate dielectric layer 242 and be in direct contact with the lower conductive layer 225. The gate dielectric layer 242 may be in direct contact with a side surface of the isolation insulating layer 248, the side surface of the channel layer 243, and side surfaces of the plurality of interconnection layers W1 to Wn. The bit line 67 may be connected to an upper end of the channel layer 243 through the plurality of bit plugs 63 and the plurality of bit pads 62.

Figure 17:
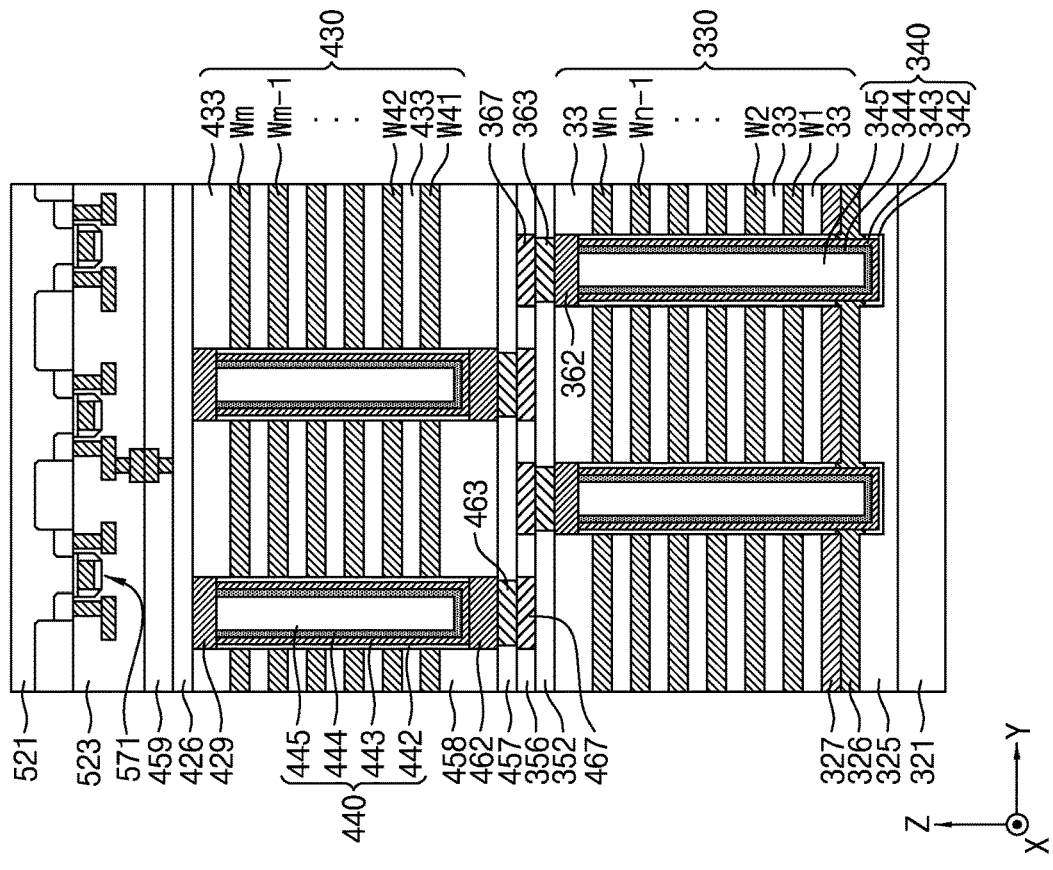
FIGS. 17 and 18 are cross-sectional views illustrating a semiconductor memory device according to an exemplary embodiment of the present inventive concepts.
Figure 18:
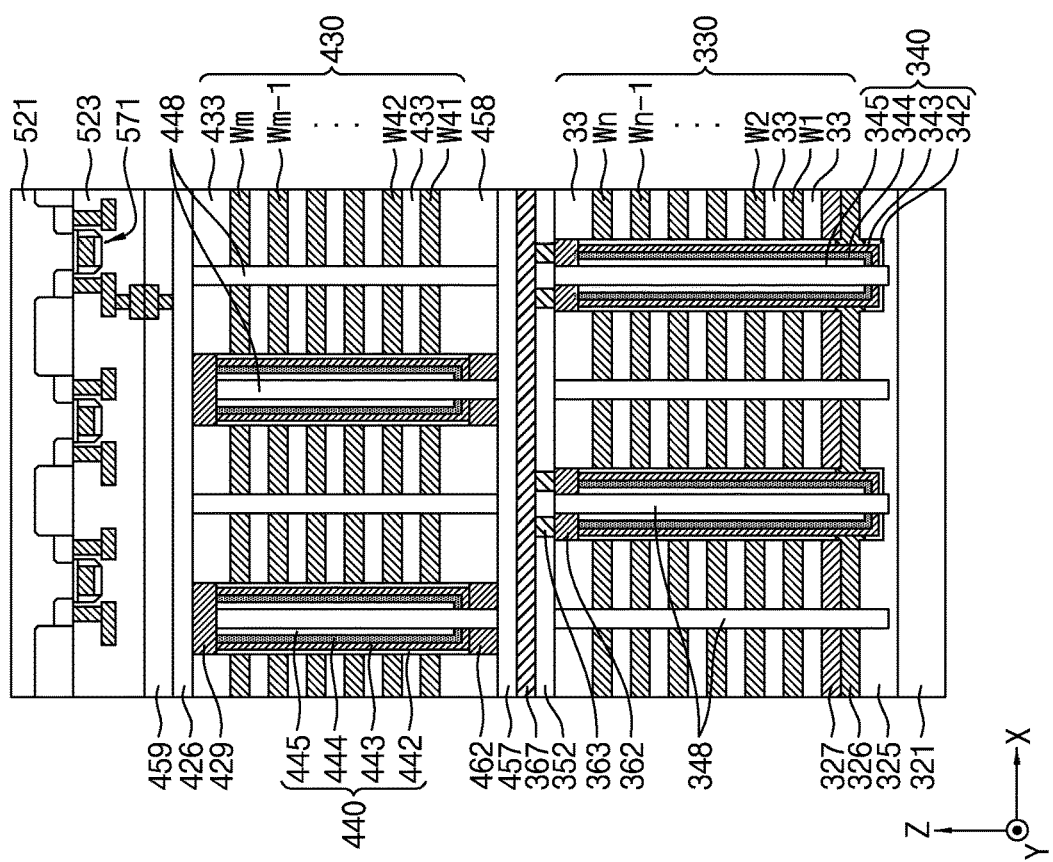

FIGS. 17 and 18 are cross-sectional views illustrating a semiconductor device according to an exemplary embodiment of the present inventive concepts. FIG. 18 is a cross-sectional view which is taken in a direction perpendicular to FIG. 17. The semiconductor memory device according to the exemplary embodiment may include a center bit line and a wafer bonding structure.

Referring to FIGS. 17 and 18, the semiconductor memory device may include a first substrate 321, a lower conductive layer 325, a buried conductive layer 326, a support plate 327, a lower stack structure 330, a plurality of lower pillar structures 340, a lower isolation insulating layer 348, a second insulating layer 352, a sixth insulating layer 356, a plurality of lower bit pads 362, a plurality of lower bit plugs 363, a plurality of lower bit lines 367, a seventh insulating layer 457, an eighth insulating layer 458, a plurality of upper bit lines 467, a plurality of upper bit plugs 463, a plurality of upper bit pads 462, an upper stack structure 430, a plurality of upper pillar structures 440, an upper isolation insulating layer 448, a source pad 429, an upper source line 426, a ninth insulating layer 459, a second substrate 521, a tenth insulating layer 523, and a plurality of transistors 571.

The plurality of transistors 571 may constitute a peripheral circuit in the tenth insulating layer 523 on the second substrate 521. As shown in the exemplary embodiment of FIG. 17, the tenth insulating layer 523 may be disposed directly on the ninth insulating layer 459 and bonded to the ninth insulating layer 459. The lower stack structure 330 may include a plurality of insulating layers 33 and a plurality of interconnection layers W1 to Wn which are alternately and repeatedly stacked (e.g., in the Z direction), as previously described. The upper stack structure 430 may include a plurality of upper insulating layers 433 and a plurality of upper interconnection layers W41 to Wm which are alternately and repeatedly stacked (e.g., in the Z direction), as previously described.

Each of the plurality of lower pillar structures 340 may include a lower gate dielectric layer 342, a lower channel layer 343, a lower variable resistance layer 344, and a lower insulating pillar 345. Each of the plurality of upper pillar structures 440 may include an upper gate dielectric layer 442, an upper channel layer 443, an upper variable resistance layer 444, and an upper insulating pillar 445.

The upper stack structures 430 and lower stack structures 330 are spaced apart in the Z direction. The plurality of lower bit lines 367 and the plurality of upper bit lines 467 may be disposed between the lower stack structure 330 and the upper stack structure 430.

Figure 19:
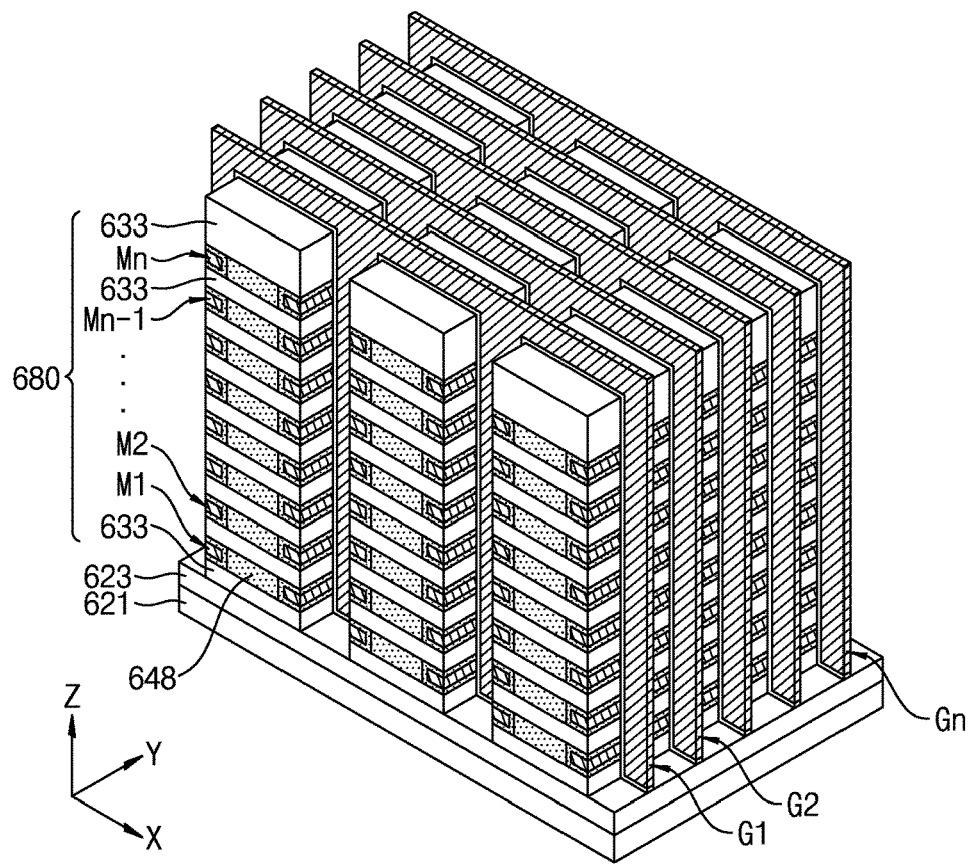
FIG. 19 is a perspective view illustrating a semiconductor memory device according to an exemplary embodiment of the present inventive concepts.
Figure 20:
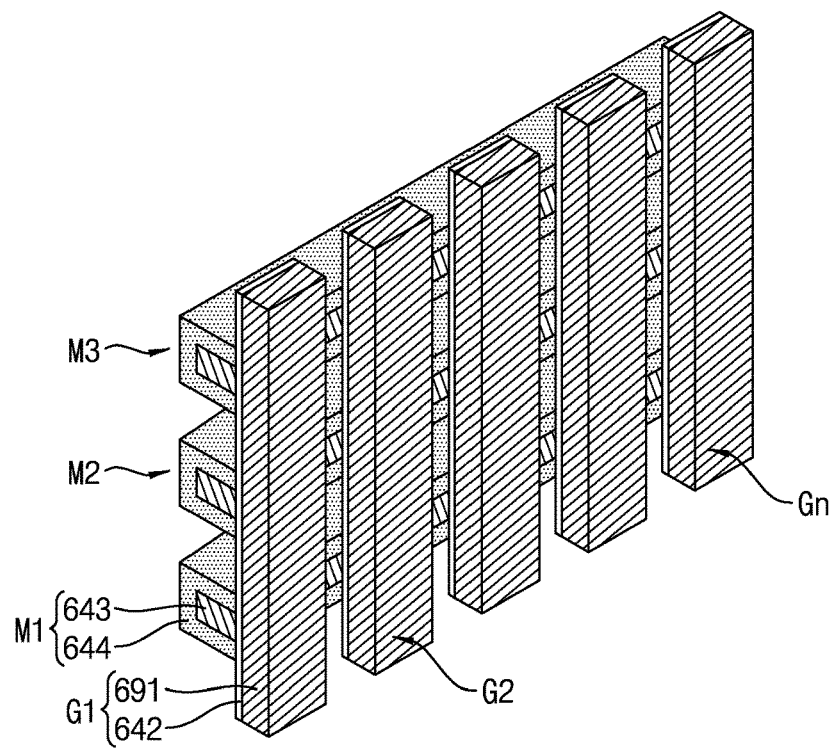
FIG. 20 is a perspective view of some components of FIG. 19 according to an exemplary embodiment of the present inventive concepts.

FIG. 19 is a perspective view illustrating a semiconductor memory device according to an exemplary embodiment of the present inventive concepts. FIG. 20 is a perspective view of some components of FIG. 19. FIGS. 21 to 26 are cross-sectional views illustrating the semiconductor memory device shown in FIG. 19.

Referring to FIG. 19, the semiconductor memory device may include a substrate 621, a first insulating layer 623, a plurality of stack structures 680, and a plurality of gate structures G1 to Gn. The plurality of gate structures G1 to Gn may extend in a plane defined by the X direction and Z direction and may be arranged in the Y direction. Each of the plurality of stack structures 680 may include a plurality of insulating layers 633 and a plurality of memory layers M1 to Mn which are alternately and repeatedly stacked. For example, the alternating insulating layers 633 and memory layers M1 to Mn may be arranged in the Z direction. Each of the plurality of stack structures 680 may further include an isolation insulating layer 648 disposed between the plurality of insulating layers 633.

Referring to FIG. 20, a semiconductor memory device may include first to third memory layers M1 to M3 and a plurality of gate structures G1 to Gn. Each of the first to third memory layers M1 to M3 may include a channel layer 643 and a variable resistance layer 644. Each of the plurality of gate structures G1 to Gn may include a gate electrode 691 and a gate dielectric layer 642. The first to third memory layers M1 to M3 may be stacked in a vertical direction (e.g., the Z direction). Each of the plurality of gate structures G1 to Gn may be disposed in a vertical direction. Each of the plurality of gate structures G1 to Gn may be in contact with side surfaces of the first to third memory layers M1 to M3 extending in the Z direction.

Figure 21:
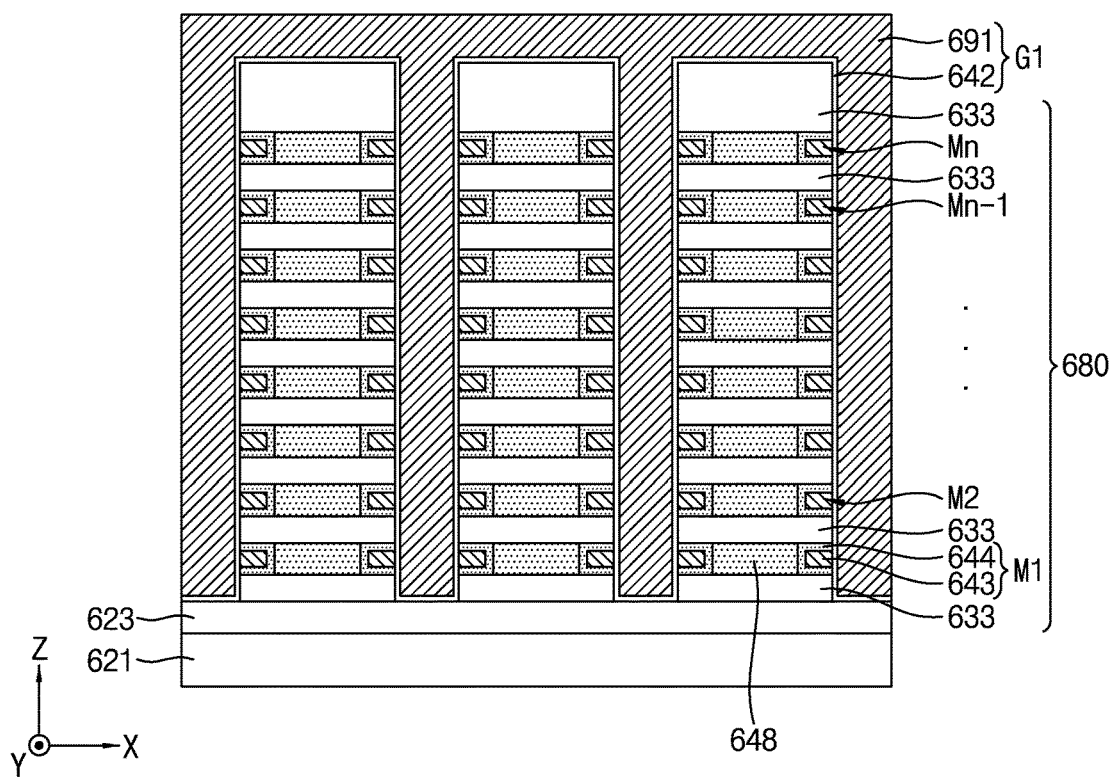
FIGS. 21 to 26 are cross-sectional views illustrating a semiconductor memory device according to an exemplary embodiment of the present inventive concepts.

Referring to FIG. 21, a semiconductor memory device may include a substrate 621, a first insulating layer 623, a plurality of stack structures 680, and a gate structure G1. Each of the plurality of stack structures 680 may include a plurality of insulating layers 633 and a plurality of memory layers M1 to Mn which are alternately and repeatedly stacked (e.g., in the Z direction). Each of the plurality of stack structures 680 may further include an isolation insulating layer 648 disposed between the plurality of insulating layers 633 (e.g., in the Z direction).

Each of the plurality of memory layers M1 to Mn may include a channel layer 643 and a variable resistance layer 644. The variable resistance layer 644 may be in direct contact with the channel layer 643. The variable resistance layer 644 may surround an upper surface, a lower surface, and one side surface of the channel layer 643. The isolation insulating layer 648 may be disposed on one side of the variable resistance layer 644. The isolation insulating layer 648 may be in contact with a side surface of the variable resistance layer 644. For example, lateral edges of the isolation insulating layer 648 extending in the Z direction may each contact a variable resistance layer 644 of a memory layer. The variable resistance layer 644 may be disposed between the isolation insulating layer 648 and the channel layer 643. The variable resistance layer 644 may extend between an upper surface of the channel layer 643 and a lower surface of an adjacent insulating layer of the plurality of insulating layers 633. The variable resistance layer 644 may extend between a lower surface of the channel layer 643 and an upper surface of an adjacent insulating layer of the plurality of insulating layers 633.

The gate structure G1 may be disposed on a side surface of each of the plurality of stack structures 680. For example, the gate structure G1 may be disposed on a side surface having a plane defined by the Z direction and X direction of the plurality of stack structures. The gate structure G1 may include a gate electrode 691 and a gate dielectric layer 642. The gate dielectric layer 642 may be disposed between the plurality of stack structures 680 and the gate electrode 691. The gate dielectric layer 642 may be disposed between the plurality of memory layers M1 to Mn and the gate electrode 691. The gate dielectric layer 642 may be in direct contact with the plurality of memory layers M1 to Mn and the gate electrode 691. The gate dielectric layer 642 may be in direct contact with a side surface of the channel layer 643 and the side surface of the variable resistance layer 644 having a plane defined by the Z direction and X direction.

Figure 22:
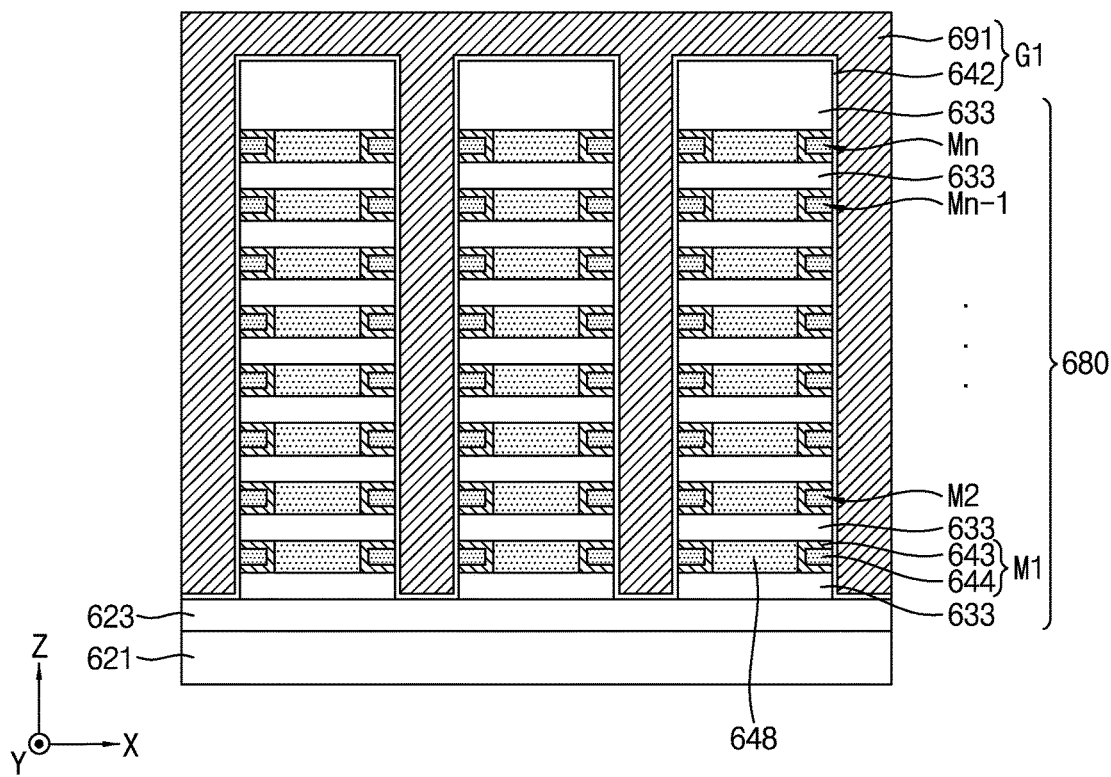

Referring to FIG. 22, the channel layer 643 may surround an upper surface, a lower surface, and one side surface of the variable resistance layer 644. The isolation insulating layer 648 may be disposed on one side of the channel layer 643. A side edge of the channel layer 643 extending in the Z direction may be disposed between the variable resistance layer 644 and the isolation insulating layer 648. An upper edge of the channel layer 643 extending in the X direction may be disposed between the upper surface (e.g., in the Z direction) of the variable resistance layer 644 and a lower surface of an adjacent insulating layer of the plurality of insulating layers 633. A lower edge of the channel layer 643 extending in the X direction may be disposed between the lower surface (e.g., in the Z direction) of the variable resistance layer 644 and an upper surface of an adjacent insulating layer of the plurality of insulating layers 633.

Figure 23:
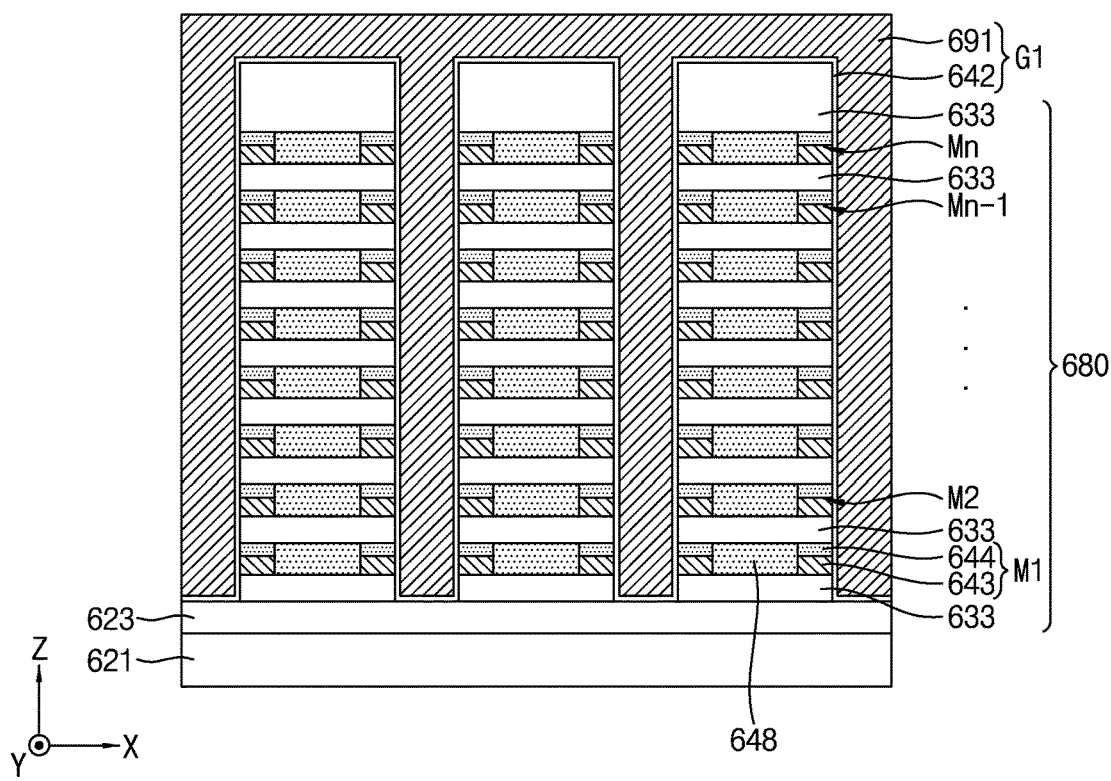

Referring to FIG. 23, the variable resistance layer 644 may be disposed on the channel layer 643. For example, a bottom surface of the variable resistance layer 644 (e.g., in the Z direction) may be disposed directly on a top surface of the channel layer (e.g., in the Z direction). The side surfaces of the variable resistance layer 644 and the channel layer 643 which extend in the Z direction may be in direct contact with a lateral edge of the isolation insulating layer 648 extending in the Z direction.

Figure 24:
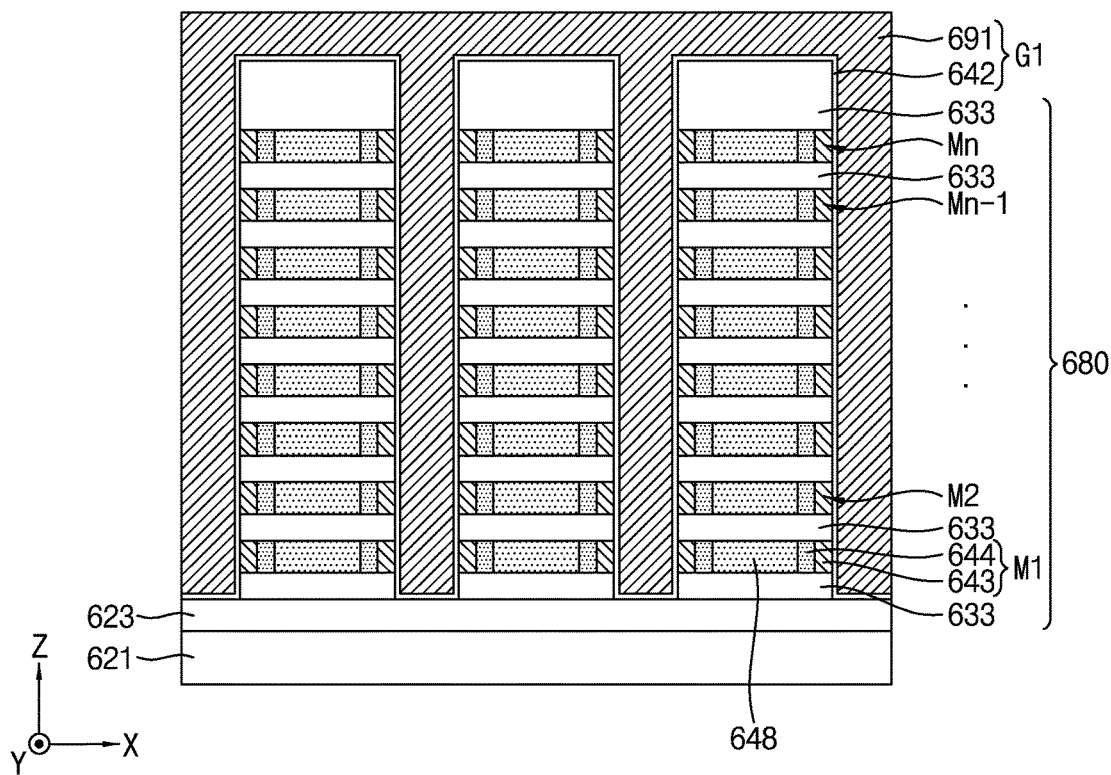

Referring to FIG. 24, the variable resistance layer 644 and the channel layer 643 may be disposed between the isolation insulating layer 648 and the gate dielectric layer 642. The variable resistance layer 644 may be disposed between the channel layer 643 and the isolation insulating layer 648. The channel layer 643 may be disposed between the variable resistance layer 644 and the gate dielectric layer 642. The gate dielectric layer 642 may be in direct contact with a side surface of the channel layer 643 extending in the Z direction and a side surface of the gate electrode 691.

Figure 25:
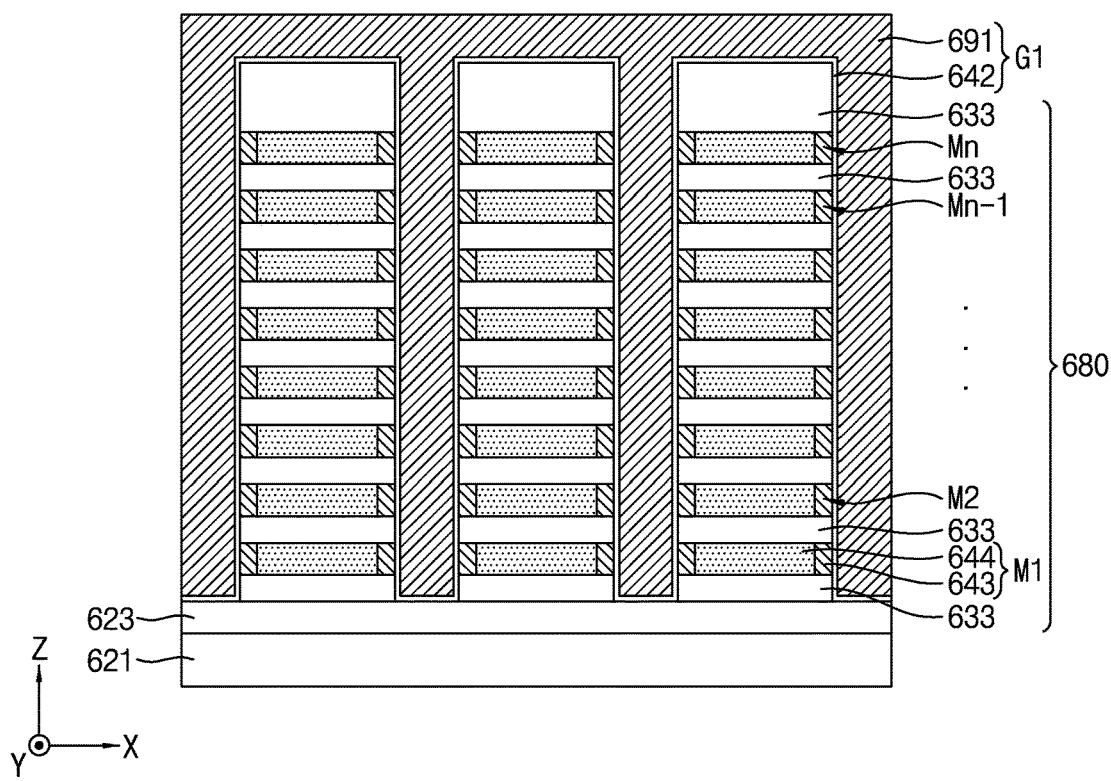

Referring to FIG. 25, the variable resistance layer 644 and the channel layer 643 may be disposed between the plurality of insulating layers 633. The channel layer 643 may be disposed between the variable resistance layer 644 and the gate dielectric layer 642. Side surfaces of the variable resistance layer 644 extending in the Z direction may be in direct contact with side surfaces of the channel layer 643 that extend in the Z direction.

Figure 26:
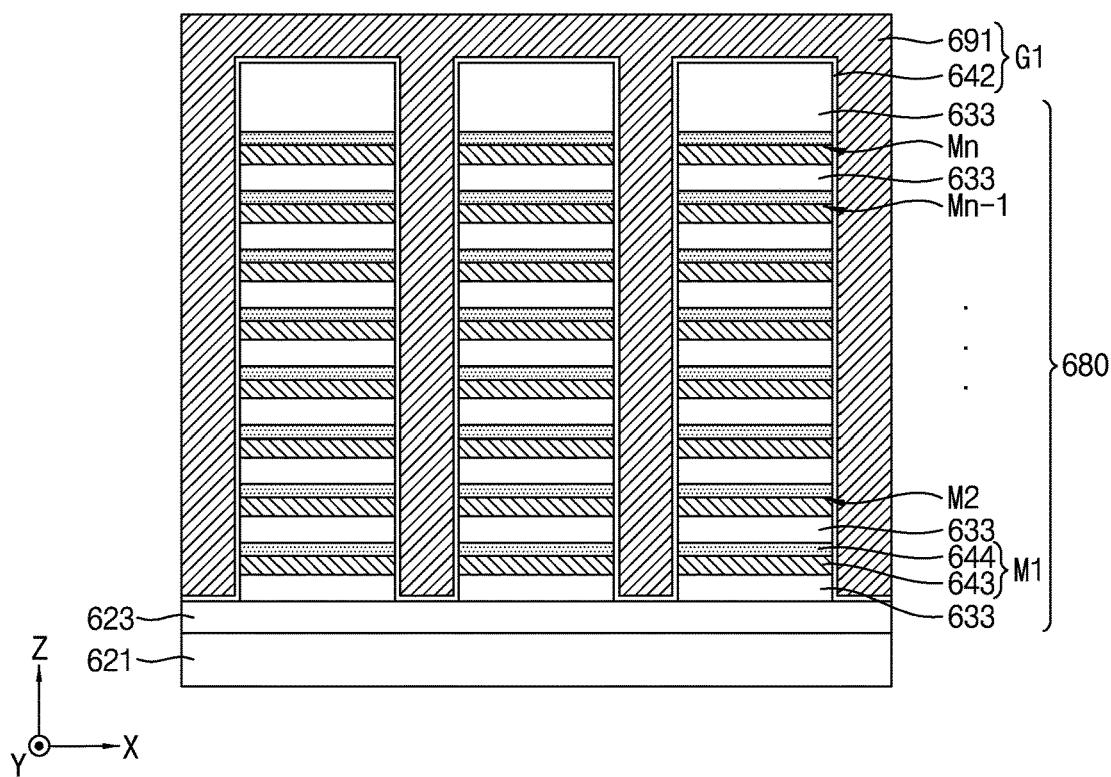

Referring to FIG. 26, a plurality of memory layers M1 to Mn may be disposed between a plurality of insulating layers 633. Each of the plurality of memory layers M1 to Mn may include a channel layer 643 and a variable resistance layer 644 disposed on the channel layer 643. For example, a bottom surface of the variable resistance layer 644 extending in the X direction may be in direct contact with a top surface of the channel layer 643 extending in the X direction. The memory layers M1 to Mn may have side surfaces extending in the Z direction that contact side surfaces of the gate dielectric layer 642 extending in the Z direction.

FIGS. 27, 28 and 31 to 33 are cross-sectional views illustrating a method of forming a semiconductor memory device according to exemplary embodiments of the present inventive concepts. FIGS. 29 and 30 are top plan views illustrating a method of forming the semiconductor memory device shown in FIGS. 27, 28, and 31 to 33 according to exemplary embodiments of the present inventive concepts.

Figure 27:
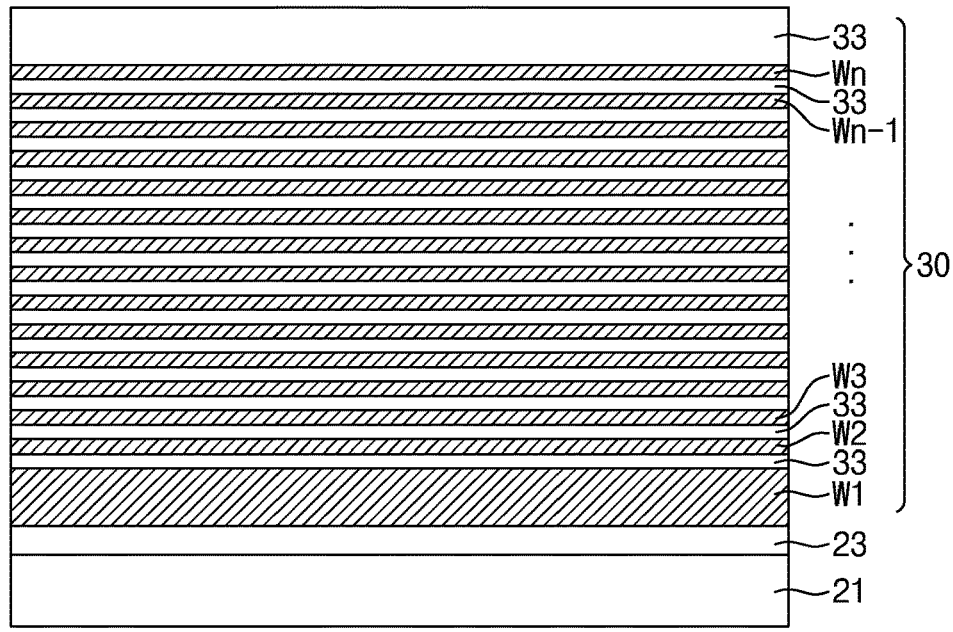
FIGS. 27, 28, 31 to 33, 35 to 37 and 39 to 43 are cross-sectional views illustrating a method of forming a semiconductor memory device according to an exemplary embodiments of the present inventive concepts.

Referring to FIG. 27, a first insulating layer 23 may be formed on a substrate 21. A stack structure 30 may be formed on the first insulating layer 23. The stack structure 30 may include a plurality of insulating layers 33 and a plurality of interconnection layers W1 to Wn which are alternately and repeatedly stacked (e.g., in a direction perpendicular to a top surface of the substrate 21).

Figure 28:
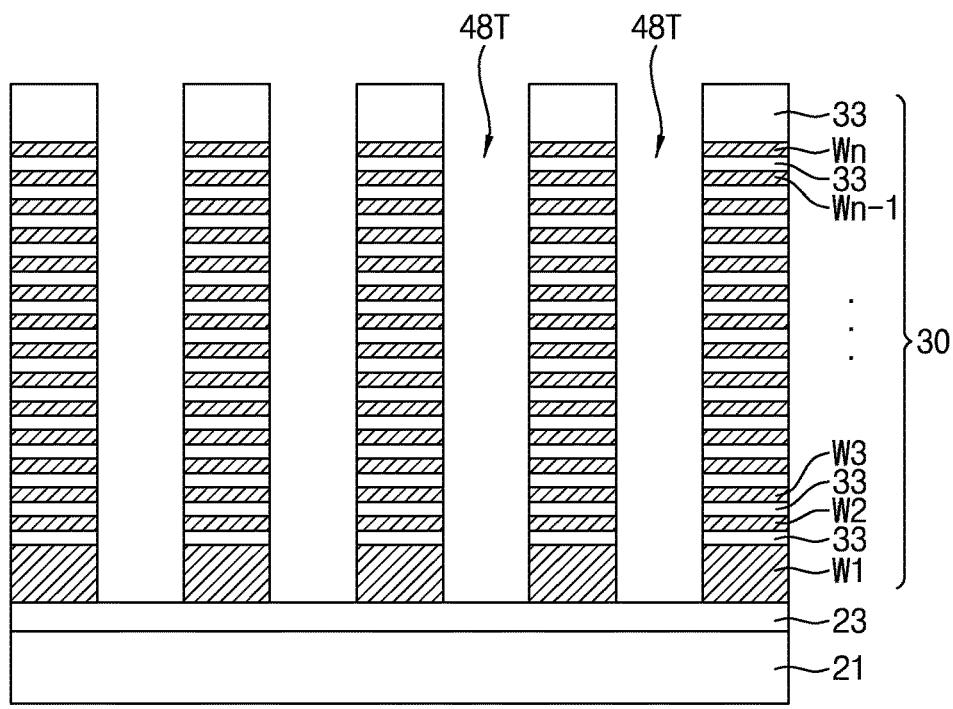
Figure 29:
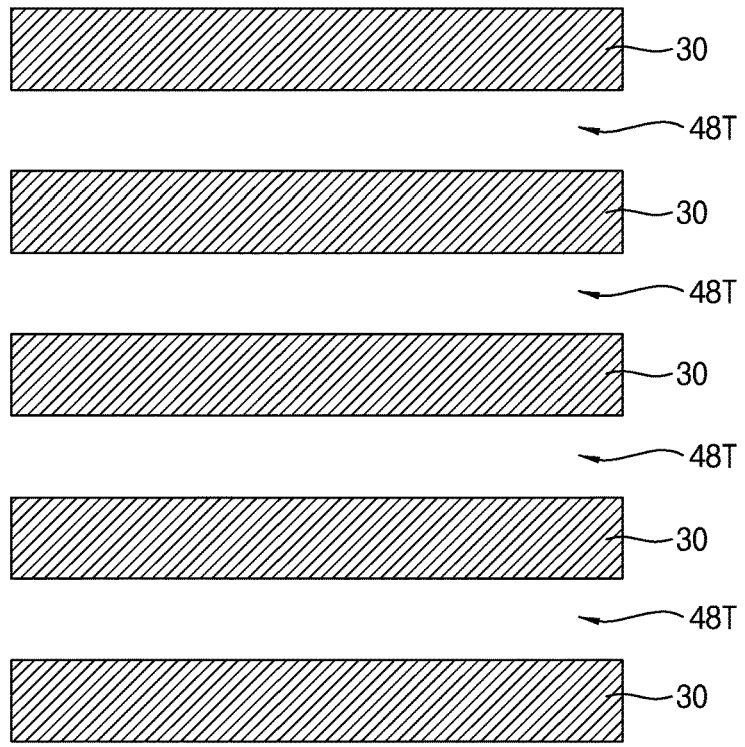
FIGS. 29, 30, 34, 38 are top plan views illustrating a method of forming a semiconductor memory device according to exemplary embodiments of the present inventive concepts.
Figure 30:
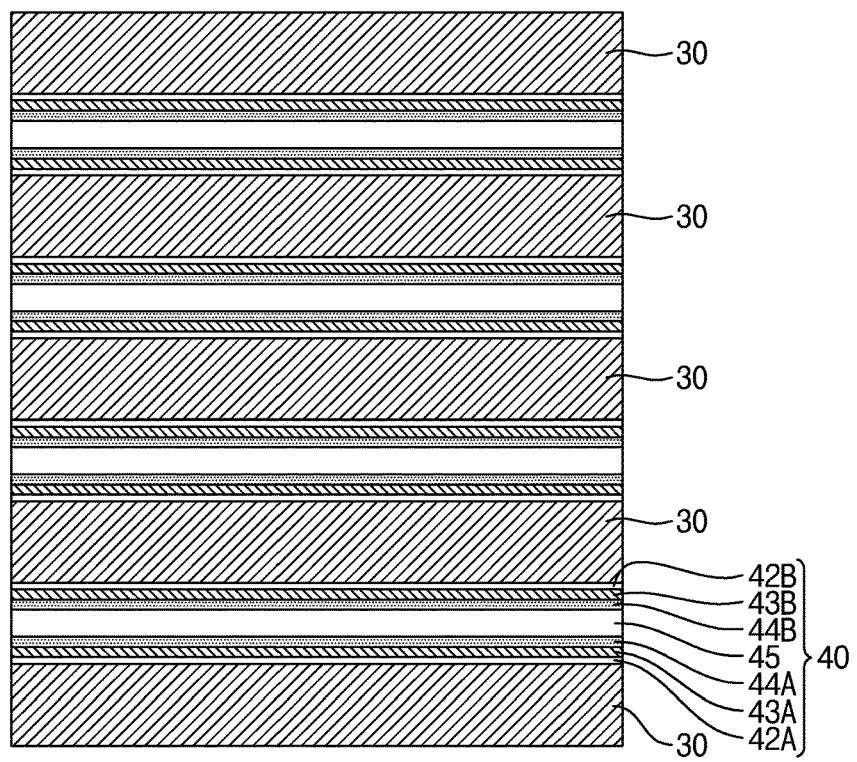

Referring to FIGS. 28 and 29, the stack structure 30 may be patterned to form a plurality of isolation trenches 48T. The plurality of isolation trenches 48T may be disposed parallel to each other. The plurality of isolation trenches 48T may intersect the stack structure 30 and extend through the stack structure 30 in a vertical direction. The stack structure 30 may be divided into several portions by the plurality of isolation trenches 48T.

In an exemplary embodiment, each of the plurality of isolation trenches 48T may have a configuration substantially perpendicular to a top surface of the substrate 21. Side surfaces of the plurality of insulating layers 33 extending in a direction perpendicular to a top surface of the substrate and side surfaces of the plurality of interconnection layers W1 to Wn extending in a direction perpendicular to a top surface of the substrate may be exposed at sidewalls of the plurality of isolation trenches 48T. The first insulating layer 23 may be exposed at bottoms of the plurality of isolation trenches 48T.

Figure 31:
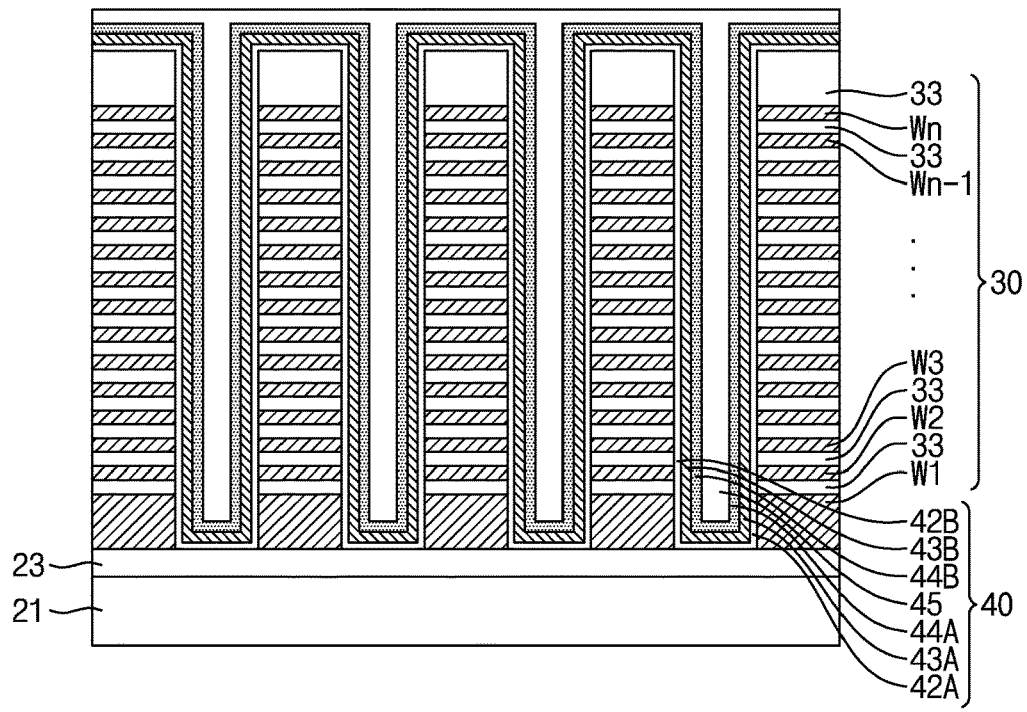

Referring to FIGS. 30 and 31, first and second gate dielectric layers 42A and 42B, first and second channel layers 43A and 43B, first and second variable resistance layers 44A and 44B, and an insulating pillar 45 may be sequentially stacked and formed in the plurality of isolation trenches 48T. The first and second gate dielectric layers 42A and 42B, the first and second channel layers 43A and 43B, the first and second variable resistance layers 44A and 44B, and the insulating pillar 45 may constitute a pillar structure 40. The pillar structure 40 may fill the plurality of isolation trenches 48T and cover the stack structure 30. For example, as shown in FIG. 31, the pillar structure 40 covers top and side surfaces of the stack structure.

Figure 32:
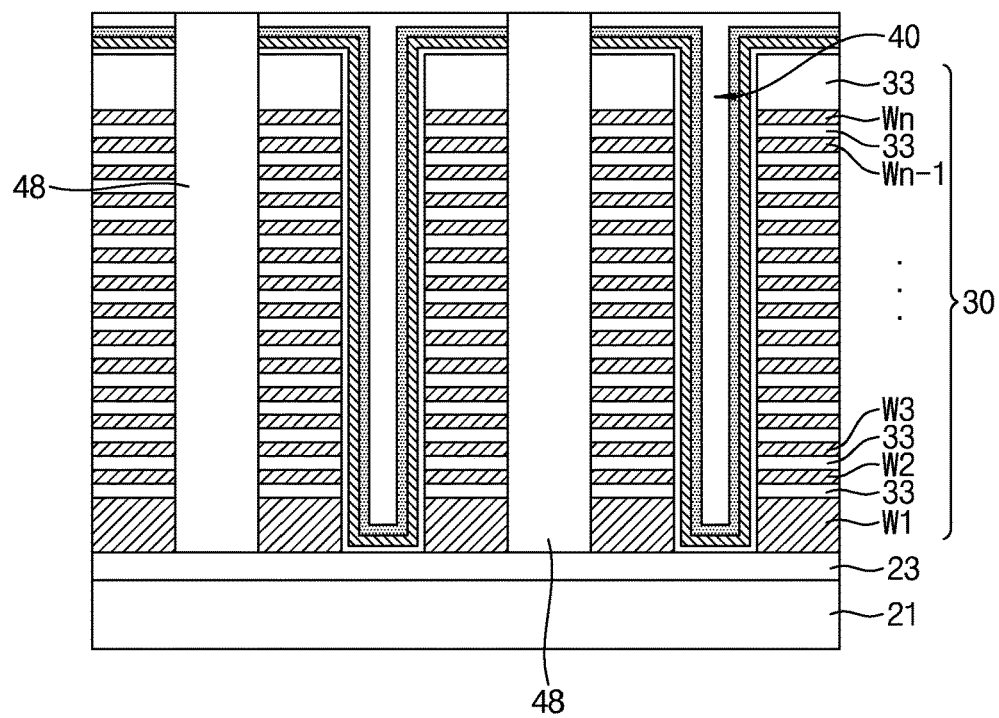

Referring to FIGS. 2 and 32, an isolation insulating layer 48 may be formed to extend through the pillar structure 40 in a vertical direction. In an exemplary embodiment, the process of forming the isolation insulating layer 48 may include a patterning process and a thin-film forming process. A lower end of the isolation insulating layer 48 may be in direct contact with the first insulating layer 23. For example, the lower end of the isolation insulating layer 48 may be in direct contact with a top surface of the first insulating layer 23.

Figure 33:
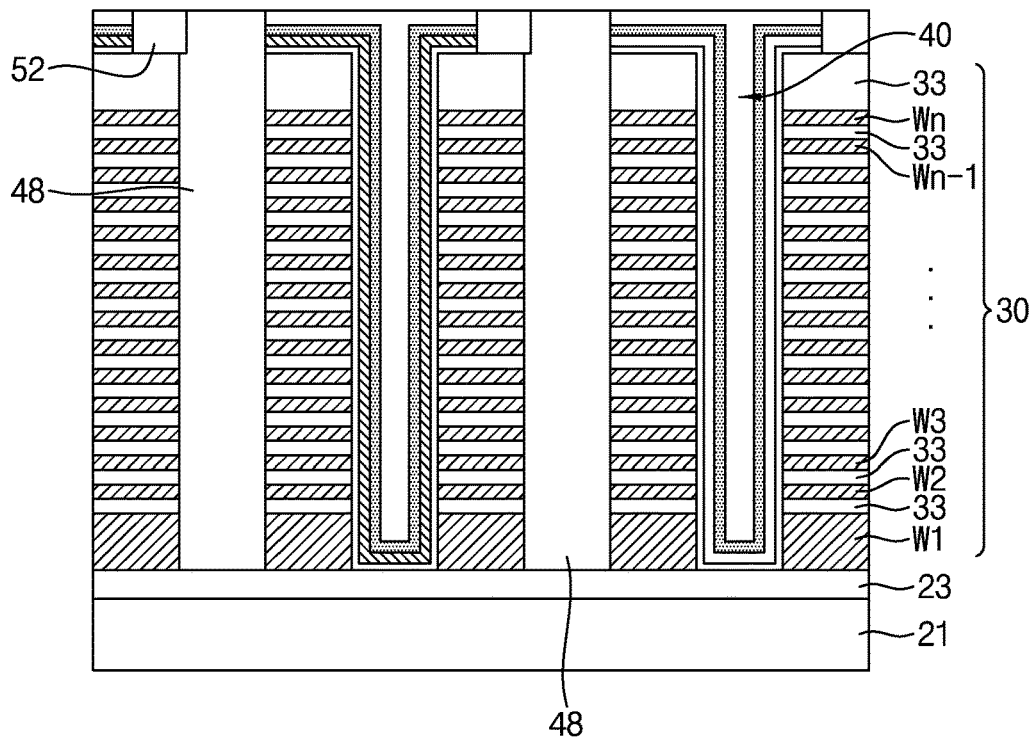

Referring to FIGS. 2 and 33, a second insulating layer 52 may be formed on the stack structure 30. The pillar structure 40 may be divided into several portions by the isolation insulating layer 48 and the second insulating layer 52.

Referring to FIGS. 2 and 3, third to fifth insulating layers 53, 54, and 55, a plurality of source plugs 61, a plurality of bit plugs 63, a plurality of source lines 65, and a bit line 67 may be formed on the pillar structure 40, the isolation insulating layer 48, and the second insulating layer 52.

Figure 34:
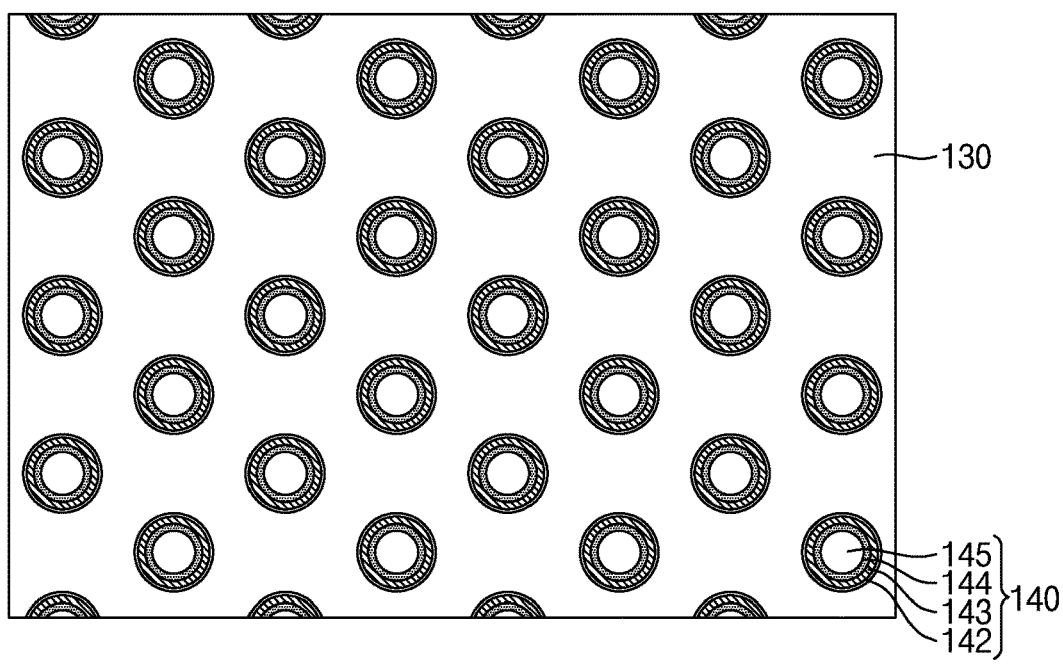
Figure 35:
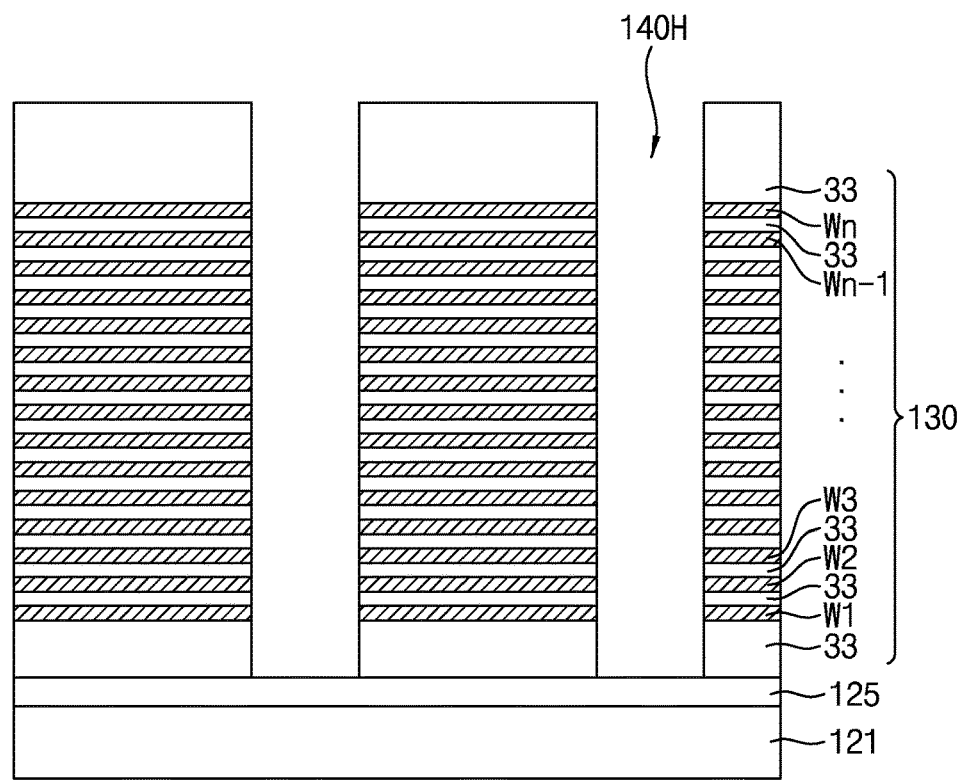
Figure 36:
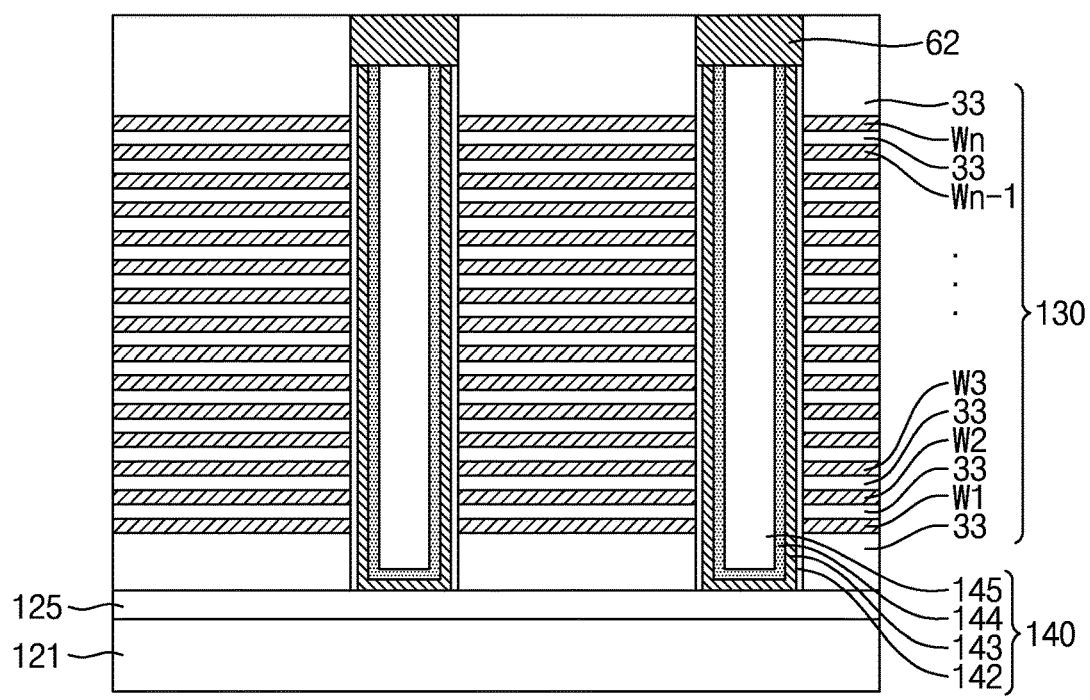
Figure 37:
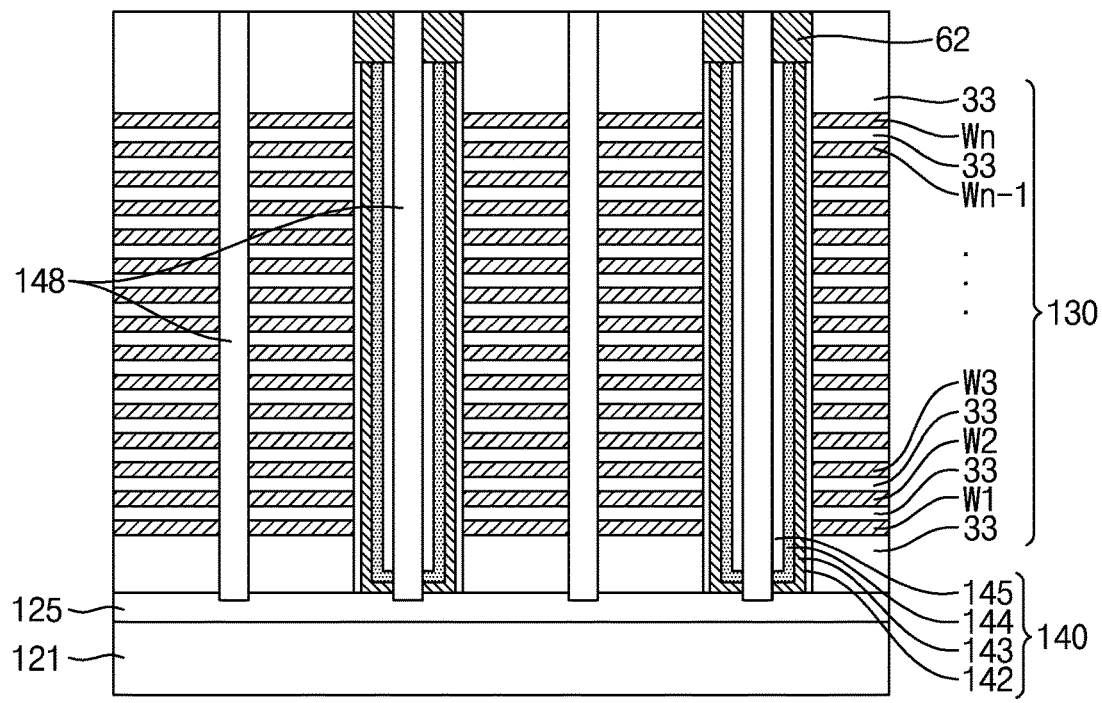

FIG. 34 is a top plan view illustrating a method of forming a semiconductor memory device according to an exemplary embodiment of the present inventive concepts. FIGS. 35 to 37 are cross-sectional views illustrating the method of forming the semiconductor memory device shown in FIG. 34.

Referring to FIGS. 34 and 35, a lower conductive layer 125 may be formed on a substrate 121. A stack structure 130 may be formed on the lower conductive layer 125. The stack structure 130 may include a plurality of insulating layers 33 and a plurality of interconnection layers W1 to Wn which are alternately and repeatedly stacked. A plurality of channel holes 140H may be formed to extend through the stack structure 130 in a vertical direction.

Referring to FIGS. 34 and 36, a plurality of pillar structures 140 may be formed inside the plurality of channel holes 140H. A plurality of bit pads 62 may be formed on the plurality of pillar structures 140. Upper ends of the plurality of pillar structures 140 may be formed at a lower level than an upper surface of the stack structure 130. Upper ends of the plurality of bit pads 62 and upper ends of the plurality of insulating layers 33 may be substantially coplanar. Each of the plurality of pillar structures 140 may include a gate dielectric layer 142, a channel layer 143, a variable resistance layer 144, and an insulating pillar 145, as previously described.

The variable resistance layer 144 may surround side surfaces and a bottom of the insulating pillar 145. The channel layer 143 may surround side surfaces and a bottom of the variable resistance layer 144. The gate dielectric layer 142 may surround side surfaces of the channel layer 143. The channel layer 143 may extend through the gate dielectric layer 142 and be in direct contact with the lower conductive layer 125. Each of the plurality of bit pads 62 may be in direct contact with the channel layer 143.

Referring to FIGS. 12 and 37, an isolation insulating layer 148 may be formed to intersect the plurality of bit pads 62, the plurality of pillar structures 140, and the stack structure 130 and extend through the plurality of bit pads 62, the plurality of pillar structures 140, and the stack structure 130 in the vertical direction. The isolation insulating layer 148 may extend through the plurality of bit pads 62, the insulating pillar 145, the variable resistance layer 144, the channel layer 143, and the gate dielectric layer 142 in a vertical direction and contact the lower conductive layer 125.

Referring again to FIGS. 12 and 13, a third insulating layer 53, a plurality of bit plugs 63, and a bit line 67 may be formed on the plurality of bit pads 62, the stack structure 130, and the isolation insulating layer 148.

Figure 38:
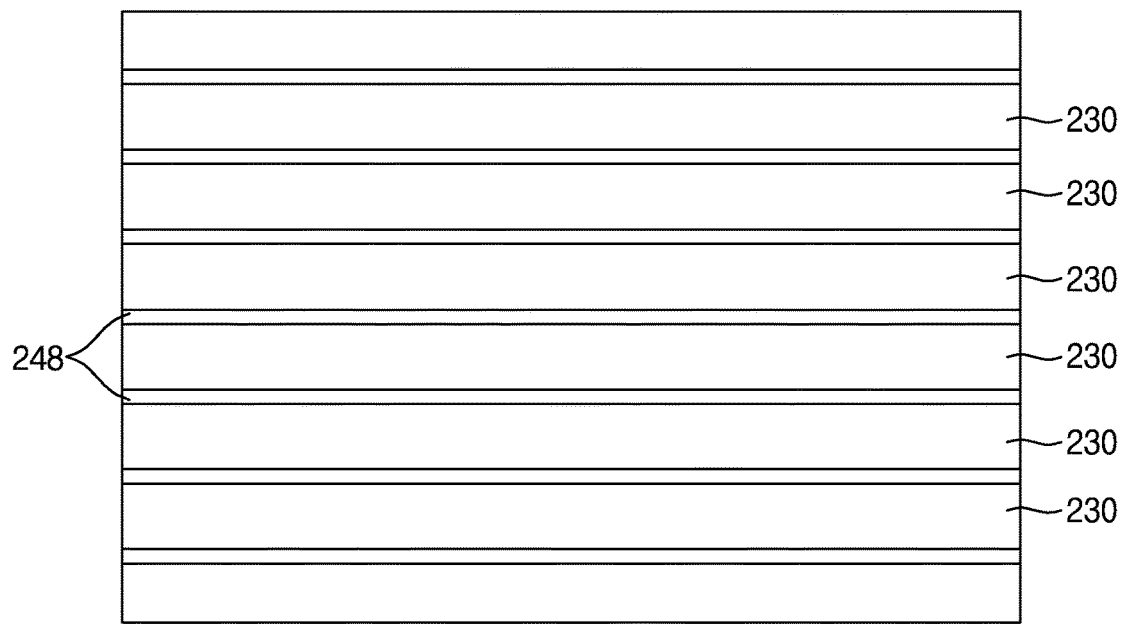
Figure 39:
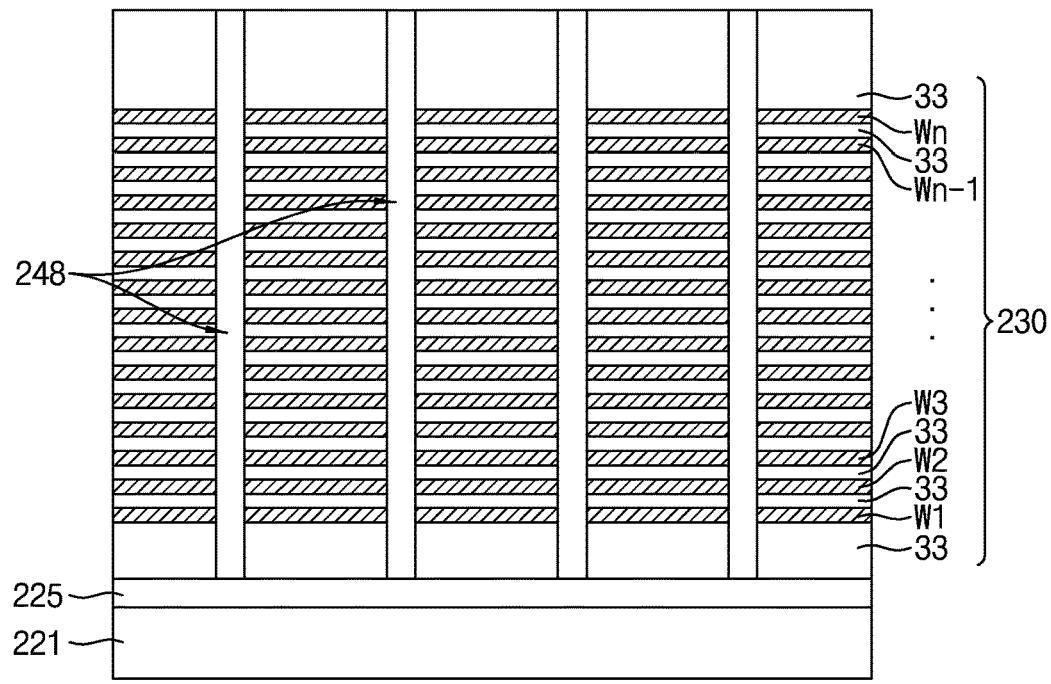
Figure 40:
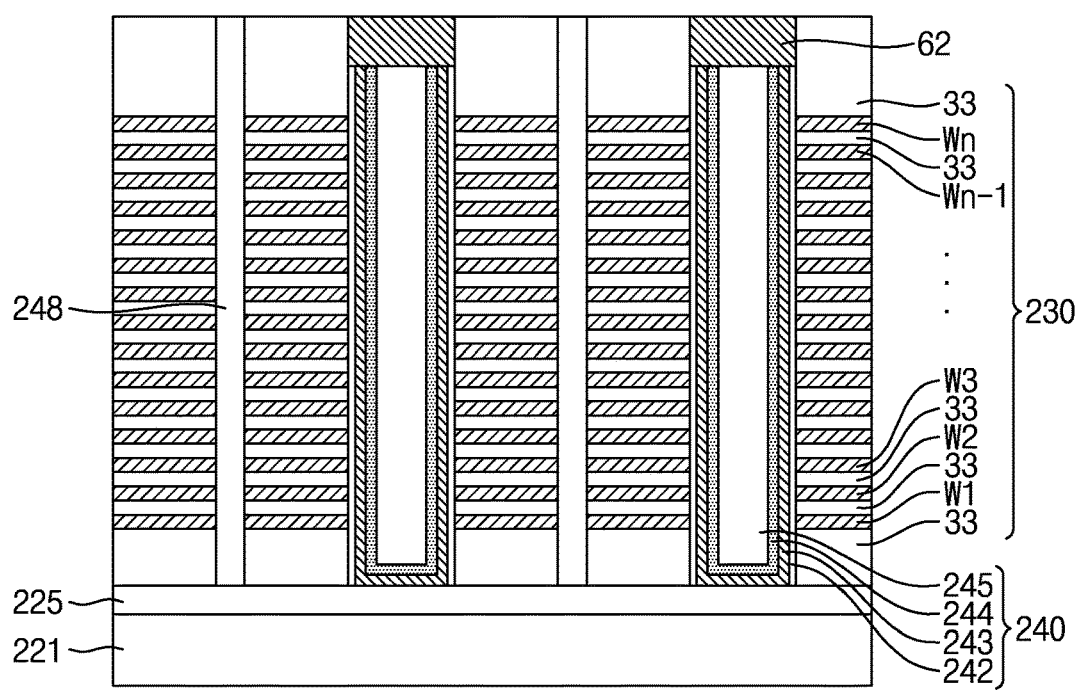
Figure 41:
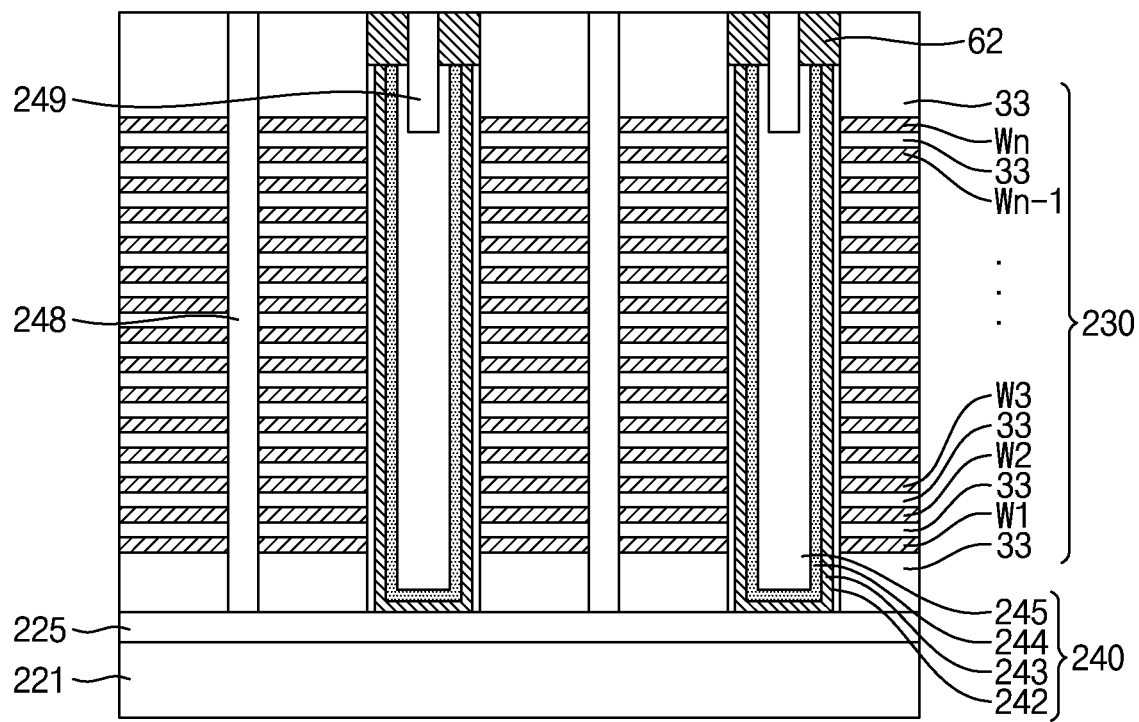

FIG. 38 is a top plan view illustrating a method of forming a semiconductor memory device according to an exemplary embodiment of the present inventive concepts. FIGS. 39 to 41 are cross-sectional views illustrating a method of forming the semiconductor memory device shown in FIG. 38 according to exemplary embodiments of the present inventive concepts.

Referring to FIGS. 38 and 39, a lower conductive layer 225 may be formed on a substrate 221. A stack structure 230 may be formed on the lower conductive layer 225. An isolation insulating layer 248 may be formed to intersect the stack structure 230 and extend through the stack structure 230 in a vertical direction. For example, a plurality of isolation insulating layers 248 may be formed parallel to each other and spaced apart in a direction perpendicular to the top surface of the substrate. The stack structure 230 may be divided into several portions by the isolation insulating layer 248. A lower end of the isolation insulating layer 248 may contact the lower conductive layer 225 (e.g., an upper surface of the lower conductive layer). The stack structure 230 may include a plurality of insulating layers 33 and a plurality of interconnection layers W1 to Wn which are alternately and repeatedly stacked.

Referring to FIGS. 15 and 40, a plurality of pillar structures 240 may be formed to intersect the isolation insulating layer 248 and extend through the stack structure 230 and the isolation insulating layer 248 in a vertical direction. Each of the plurality of pillar structures 240 may include a gate dielectric layer 242, a channel layer 243, a variable resistance layer 244, and an insulating pillar 245, as previously described. A plurality of bit pads 62 may be formed on the plurality of pillar structures 240. For example, the bit pads 62 may be formed on top surfaces of the pillar structures 240.

Referring to FIGS. 15 and 41, a pad isolation layer 249 may be formed to extend through the plurality of bit pads 62. The pad isolation layer 249 may be formed to extend through the plurality of bit pads 62 and may have a bottom surface that is disposed on an upper region of the insulating pillar 245 of the pillar structure.

Referring again to FIGS. 15 and 16, a third insulating layer 53, a plurality of bit plugs 63, and a bit line 67 may be formed on the stack structure 230, the isolation insulating layer 248, the plurality of bit pads 62, and the pad isolation layer 249.

Figure 42:
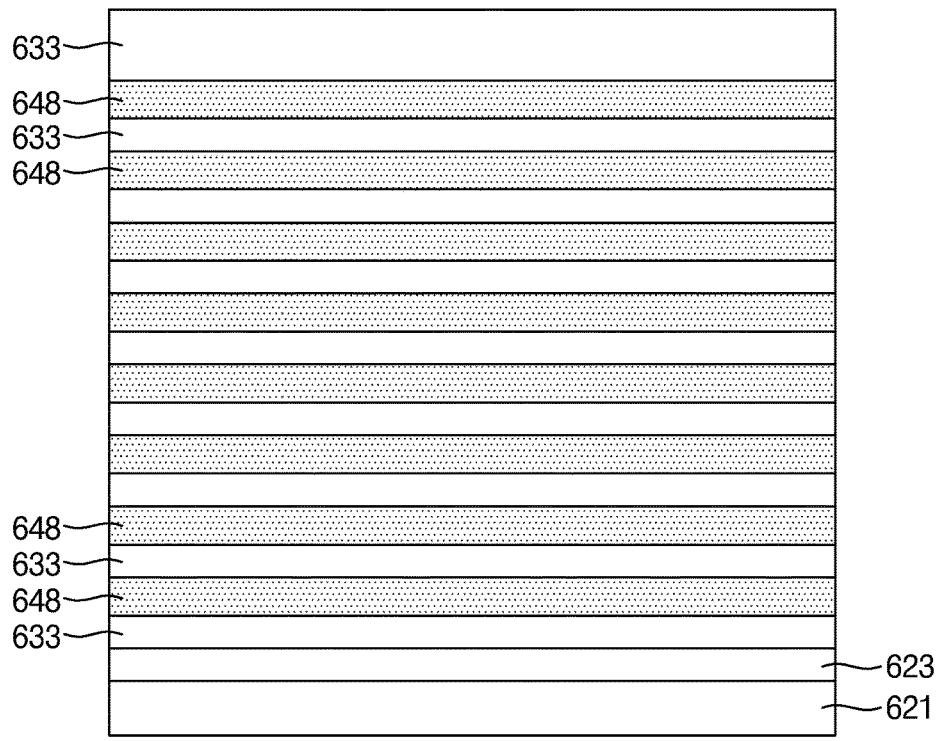
Figure 43:
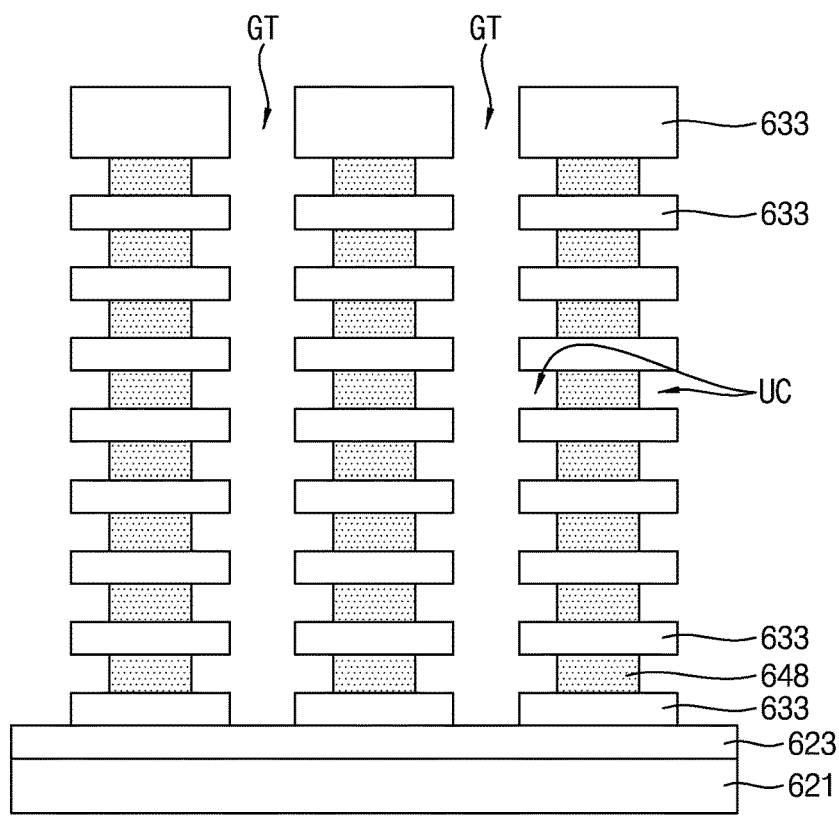

FIGS. 42 and 43 are cross-sectional views illustrating a method of forming a semiconductor memory device according to exemplary embodiments of the present inventive concept.

Referring to FIG. 42, a first insulating layer 623 may be formed on a substrate 621. A plurality of insulating layers 633 and a plurality of isolation insulating layers 648 may be alternately and repeatedly stacked on the first insulating layer 623 in a direction perpendicular to a top surface of the substrate 621. Each of the plurality of isolation insulating layers 648 may be formed between the plurality of insulating layers 633. The plurality of isolation insulating layers 648 may include a material having an etch selectivity with respect to the plurality of insulating layers 633. For example, the plurality of insulating layers 633 may include silicon oxide, and the plurality of isolation insulating layers 648 may include silicon nitride. However, exemplary embodiments of the present inventive concepts are not limited thereto.

Referring to FIG. 43, the plurality of insulating layers 633 and the plurality of isolation insulating layers 648 may be patterned to form a plurality of gate trenches GT. The plurality of isolation insulating layers 648 exposed inside the plurality of gate trenches GT may be selectively etched to form a plurality of undercut regions UC. Each of the plurality of undercut regions UC may be formed between the plurality of insulating layers 633. Each of the plurality of undercut regions UC may be in communication with a corresponding one of the plurality of gate trenches GT. Each of the plurality of isolation insulating layers 648 may be retained between the plurality of undercut regions UC. Side surfaces of the plurality of isolation insulating layers 648 extending in a direction perpendicular to a top surface of the substrate 621 may be exposed inside the plurality of undercut regions UC.

Referring again to FIGS. 19 and 21, a plurality of memory layers M1 to Mn may be formed inside the plurality of undercut regions UC. Each of the plurality of memory layers M1 to Mn may include a channel layer 643 and a variable resistance layer 644. A plurality of gate structures G1 to Gn may be formed inside the plurality of gate trenches GT.

According to an exemplar embodiment of the present inventive concepts, a pillar structure can be disposed on a side surface of a stack structure. The pillar structure can include an insulating pillar, a variable resistance layer, a channel layer, and a gate dielectric layer. The channel layer can be disposed between the variable resistance layer and the gate dielectric layer. Therefore, a semiconductor memory device having a high integration density and exhibiting a low power consumption may be provided.

While the exemplary embodiments of the present inventive concepts have been described with reference to the accompanying drawings, it should be understood by those skilled in the art that various modifications may be made without departing from the scope of the inventive concept and without changing essential features thereof. Therefore, the above-described exemplary embodiments should be considered in a descriptive sense only and not for purposes of limitation.

What is claimed is:

1. A semiconductor memory device comprising:
a stack structure comprising a plurality of insulating layers and a plurality of interconnection layers that are alternately and repeatedly stacked on a substrate, wherein an uppermost insulating layer of the plurality of insulating layers is disposed directly above an uppermost interconnection layer of the plurality of interconnection layers; and
a pillar structure disposed on a side surface of the stack structure,
wherein the pillar structure comprises:
an insulating pillar;
a variable resistance layer disposed on the insulating pillar and positioned between the insulating pillar and the stack structure;
a channel layer disposed on the variable resistance layer and positioned between the variable resistance layer and the stack structure; and
a gate dielectric layer disposed on the channel layer and positioned between the plurality of interconnection layers and the channel layer,
wherein the channel layer is disposed between the variable resistance layer and the gate dielectric layer,
wherein heights of upper surfaces of the insulating pillar, the variable resistance layer, the channel layer and the gate dielectric layer from an upper surface of the substrate to the upper surfaces of the insulating pillar, the variable resistance layer, the channel layer and the gate dielectric layer, respectively, are greater than a height of an upper surface of the uppermost insulating layer from the upper surface of the substrate to the upper surface of the uppermost insulating layer.

2. The semiconductor memory device of claim 1, wherein the variable resistance layer comprises at least one compound selected from the group consisting of NiO, CuO, CoO, $Fe_2O_3$, HfO, $TiO_2$, $Ta_2O_5$, $Nb_2O_5$, $SrTiO_3$ (STO), $SrZrO_3$, AlO, SiO, SiN, lanthanum strontium manganese oxide (LSMO), lanthanum calcium manganese oxide (LCMO), praseodymium calcium manganese oxide (PCMO), praseodymium lanthanum calcium manganese oxide (PLCMO), yttrium barium copper oxide (YBCO), bismuth strontium calcium copper oxide (BSCCO), Bi:SrTiO$_3$, Cr:SrTiO$_3$, HfSiO, AlSiO, tungsten oxide (WO), Mott, GeSbTe, carbon (C)-doped GeSbTe, nitrogen (N)-doped GeSbTe, SnSbTe, GeAsTe, GeSbSe, GeTe—$Sb_2Te_3$, $Zr_{60}Al_{15}Ni_{25}$, and Fe—Co—B—Si—Nb.

3. The semiconductor memory device of claim 1, wherein the variable resistance layer is in direct contact with the channel layer.

4. The semiconductor memory device of claim 1, wherein the channel layer comprises polysilicon.

5. The semiconductor memory device of claim 1, further comprising a bit line connected to a first end of the channel layer.

6. The semiconductor memory device of claim 1, further comprising a source line connected to a second end of the channel layer.

7. The semiconductor memory device of claim 1, wherein the gate dielectric layer is in direct contact with the plurality of interconnection layers and the channel layer.

8. A semiconductor memory device comprising:
a first stack structure and a second stack structure each comprising a plurality of insulating layers and a plurality of interconnection layers that are alternately and repeatedly stacked on a substrate;
an isolation insulating layer disposed between the first and second stack structures; and
a pillar structure disposed between the first and second stack structures and configured to extend through the isolation insulating layer,
wherein the pillar structure comprises:
an insulating pillar;
a first variable resistance layer disposed on the insulating pillar and positioned between the insulating pillar and the first stack structure;
a second variable resistance layer disposed on the insulating pillar and positioned between the insulating pillar and the second stack structure;
a first channel layer disposed on the first variable resistance layer and positioned between the first variable resistance layer and the first stack structure
a second Channel layer disposed on the second variable resistance layer and positioned between the second variable resistance layer and the second stack structure; and
a first gate dielectric layer disposed on the first channel layer and positioned between the first channel layer and the first stack structure; and a second gate dielectric layer disposed on the second channel layer and positioned between the second channel layer and the second stack structure, wherein the isolation insulating layer directly contacts the first and second stack structures and the pillar structure and extends through the first and second stack structures and the pillar structure in the vertical direction.

9. The semiconductor memory device of claim 8, wherein the second channel layer is continuous with the first channel layer.

10. The semiconductor memory device of claim 9, further comprising a bit line connected to a first end of the first channel layer and a source line connected to a second end of the second channel layer.

11. The semiconductor memory device of claim 9, wherein the second variable resistance layer is continuous with the first variable resistance layer.

12. The semiconductor memory device of claim 8, wherein the first variable resistance layer is in direct contact with the insulating pillar and the first channel layer, and the second variable resistance layer is in direct contact with the insulating pillar and the second channel layer.

13. The semiconductor memory device of claim 8, wherein the first gate dielectric layer is in direct contact with the plurality of interconnection layers and the first channel layer, and the second gate dielectric layer is in direct contact with the plurality of interconnection layers and the second channel layer.

14. The semiconductor memory device of claim 8, wherein a lateral width of the isolation insulating layer is less than a lateral width of the pillar structure.

15. The semiconductor memory device of claim 14, wherein the first gate dielectric layer extends between the isolation insulating layer and the first stack structure, and the second gate dielectric layer extends between the isolation insulating layer and the second stack structure.

16. The semiconductor memory device of claim 1, wherein the pillar structure extends above the stack structure in a thickness direction of the semiconductor memory device.

17. The semiconductor memory device of claim 8, wherein heights of upper surfaces of the insulating pillar, the first and second variable resistance layers, the first and second channel layers and the first and second gate dielectric layers from an upper surface of the substrate to the upper surfaces of the insulating pillar, the first and second variable resistance layers, the first and second channel layers and the first and second gate dielectric layers, respectively, are greater than a height of an uppermost insulating layer of the plurality of insulating layers of the first and second stack structures that is disposed directly above an uppermost interconnection layer of the plurality of interconnection layers of the first and second stack structures, the height of the uppermost insulating layer is from the upper surface of the substrate to the upper surface of the uppermost insulating layer.

* * * * *